(12) United States Patent
Elam et al.

(10) Patent No.: US 11,901,169 B2
(45) Date of Patent: Feb. 13, 2024

(54) BARRIER COATINGS

(71) Applicants: UCHICAGO ARGONNE, LLC, Chicago, IL (US); INCOM, INC., Charlton, MA (US)

(72) Inventors: Jeffrey W. Elam, Elmhurst, IL (US); Anil U. Mane, Naperville, IL (US); Mark Popecki, Durham, NH (US); Michael Minot, Andover, MA (US)

(73) Assignees: UCHICAGO ARGONNE, LLC, Chicago, IL (US); INCOM, INC., Charlton, MA (US)

( * ) Notice: Subject to any disclaimer, the term of this patent is extended or adjusted under 35 U.S.C. 154(b) by 8 days.

(21) Appl. No.: 17/671,135

(22) Filed: Feb. 14, 2022

(65) Prior Publication Data
US 2023/0260736 A1    Aug. 17, 2023

(51) Int. Cl.
| | | |
|---|---|---|
| H01J 9/12 | (2006.01) | |
| H01J 43/24 | (2006.01) | |
| C23C 16/455 | (2006.01) | |
| C23C 16/40 | (2006.01) | |
| H01J 9/42 | (2006.01) | |
| H01J 40/04 | (2006.01) | |
| H01J 40/16 | (2006.01) | |

(52) U.S. Cl.
CPC ............ *H01J 9/125* (2013.01); *C23C 16/403* (2013.01); *C23C 16/45527* (2013.01); *C23C 16/45553* (2013.01); *H01J 9/42* (2013.01); *H01J 40/04* (2013.01); *H01J 40/16* (2013.01); *H01J 43/246* (2013.01)

(58) Field of Classification Search
CPC .... H01J 9/125; H01J 9/42; H01J 40/04; H01J 40/16; H01J 43/246; C23C 16/403; C23C 16/45527; C23C 16/45553
See application file for complete search history.

(56) References Cited

U.S. PATENT DOCUMENTS

| | | | |
|---|---|---|---|
| 3,233,014 A | 2/1966 | Bickerdike et al. | |
| 3,238,054 A | 3/1966 | Bickerdike et al. | |
| 3,369,920 A | 2/1968 | Bourdeau et al. | |
| 3,520,667 A | 7/1970 | Taylor | |
| 3,537,426 A | 11/1970 | Spiller | |

(Continued)

FOREIGN PATENT DOCUMENTS

| | | |
|---|---|---|
| EP | 0 256 073 B1 | 2/1988 |
| FR | 2980486 A1 | 3/2013 |

(Continued)

OTHER PUBLICATIONS

"Anopore Inorganic Membranes," Whatman Product Catalog, pp. 67-69 (2009).

(Continued)

*Primary Examiner* — Seung C Sohn
(74) *Attorney, Agent, or Firm* — Foley & Lardner, LLP

(57) ABSTRACT

A secondary electron emissive layer resistant to infiltration and fouling. A barrier layer is formed by atomic layer deposition. The barrier layer may be an emissive layer and/or an interlayer. The barrier layer may form an interlayer that is a part of an electron amplifier positioned between an emissive layer and a resistive layer. The barrier layer is resistive to fluorine migration from either the emissive layer or the resistive layer.

15 Claims, 16 Drawing Sheets

(56) References Cited

U.S. PATENT DOCUMENTS

| | | |
|---|---|---|
| 3,673,051 A | 6/1972 | Clark et al. |
| 3,673,457 A | 6/1972 | Sackinger et al. |
| 3,739,216 A | 6/1973 | Pakswer |
| 3,895,084 A | 7/1975 | Bauer |
| 3,991,248 A | 11/1976 | Bauer |
| 4,051,403 A | 9/1977 | Feingold et al. |
| 4,341,592 A | 7/1982 | Shortes et al. |
| 4,569,805 A | 2/1986 | Hume et al. |
| 4,625,106 A | 11/1986 | Bender et al. |
| 4,757,229 A | 7/1988 | Schmidt et al. |
| 4,823,734 A | 4/1989 | Christin |
| 4,853,020 A | 8/1989 | Sink |
| 4,894,160 A | 1/1990 | Abe et al. |
| 4,912,314 A | 3/1990 | Sink |
| 4,963,393 A | 10/1990 | Goela et al. |
| 5,039,357 A | 8/1991 | Epler et al. |
| 5,048,807 A | 9/1991 | Martinez et al. |
| 5,068,634 A | 11/1991 | Shrier |
| 5,086,248 A | 2/1992 | Horton et al. |
| 5,126,249 A | 6/1992 | Becker et al. |
| 5,141,775 A | 8/1992 | Patrigeon et al. |
| 5,154,948 A | 10/1992 | Patrigeon et al. |
| 5,160,544 A | 11/1992 | Garg et al. |
| 5,177,878 A | 1/1993 | Visser |
| 5,202,158 A | 4/1993 | Sakagami et al. |
| 5,216,249 A | 6/1993 | Jones et al. |
| 5,334,840 A | 8/1994 | Newacheck et al. |
| 5,350,480 A | 9/1994 | Gray |
| 5,378,960 A | 1/1995 | Tasker et al. |
| 5,391,101 A | 2/1995 | Aebi et al. |
| 5,402,034 A | 3/1995 | Blouch et al. |
| 5,472,650 A | 12/1995 | Johnson et al. |
| 5,480,678 A | 1/1996 | Rudolph et al. |
| 5,529,950 A | 6/1996 | Hoenlein et al. |
| 5,726,076 A | 3/1998 | Tasker et al. |
| 5,738,908 A | 4/1998 | Rey et al. |
| 5,820,686 A | 10/1998 | Moore |
| 5,904,957 A | 5/1999 | Christin et al. |
| 5,914,278 A | 6/1999 | Boitnott et al. |
| 5,916,633 A | 6/1999 | Lackey et al. |
| 5,945,177 A | 8/1999 | Hack et al. |
| 5,964,320 A | 10/1999 | Kato et al. |
| 5,997,713 A | 12/1999 | Beetz et al. |
| 6,197,374 B1 | 3/2001 | Huttinger et al. |
| 6,200,893 B1 | 3/2001 | Sneh |
| 6,300,640 B1 | 10/2001 | Bhargava et al. |
| 6,311,001 B1 | 10/2001 | Rosine |
| 6,420,279 B1 | 7/2002 | Ono et al. |
| 6,479,826 B1 | 11/2002 | Klann et al. |
| 6,495,837 B2 | 12/2002 | Odom et al. |
| 6,503,330 B1 | 1/2003 | Sneh et al. |
| 6,545,281 B1 | 4/2003 | McGregor et al. |
| 6,572,371 B1 | 6/2003 | Sion et al. |
| 6,585,823 B1 | 7/2003 | Van Wijck |
| 6,613,383 B1 | 9/2003 | George et al. |
| 6,669,988 B2 | 12/2003 | Daws et al. |
| 6,713,177 B2 | 3/2004 | George et al. |
| 6,876,711 B2 | 4/2005 | Wallace et al. |
| 6,913,827 B2 | 7/2005 | George et al. |
| 7,164,138 B2 | 1/2007 | McGregor et al. |
| 7,187,487 B2 * | 3/2007 | Przybyla ............ G02B 26/0833 359/298 |
| 7,233,007 B2 | 6/2007 | Downing et al. |
| 7,335,594 B1 | 2/2008 | Wang et al. |
| 7,557,229 B2 | 7/2009 | Gordon et al. |
| 7,595,270 B2 | 9/2009 | Elers et al. |
| 7,759,138 B2 | 7/2010 | Beaulieu et al. |
| 7,842,214 B2 | 11/2010 | Romdhane et al. |
| 7,855,493 B2 | 12/2010 | Sullivan et al. |
| 7,892,646 B1 | 2/2011 | Rudolph et al. |
| 7,972,569 B2 | 7/2011 | Elam et al. |
| 7,977,617 B2 | 7/2011 | Sullivan et al. |
| 7,981,472 B2 | 7/2011 | Dalton et al. |
| 8,052,884 B2 | 11/2011 | Sullivan et al. |
| 8,101,480 B1 | 1/2012 | Kim et al. |
| 8,344,241 B1 | 1/2013 | Vidu et al. |
| 8,404,878 B2 | 3/2013 | Pallem et al. |
| 8,604,440 B2 | 12/2013 | Frisch et al. |
| 8,969,823 B2 | 3/2015 | Elam et al. |
| 9,255,327 B2 | 2/2016 | Winter et al. |
| 9,263,689 B2 | 2/2016 | O'Carroll et al. |
| 9,382,615 B2 | 7/2016 | Mantymaki et al. |
| 9,704,900 B1 | 7/2017 | Xia et al. |
| 10,497,530 B2 | 12/2019 | Feigelson et al. |
| 10,515,798 B2 | 12/2019 | Park et al. |
| 10,796,874 B2 | 10/2020 | Wagner et al. |
| 11,111,578 B1 * | 9/2021 | Elam .................. C23C 16/4408 |
| 2001/0000104 A1 | 4/2001 | Li et al. |
| 2001/0037761 A1 | 11/2001 | Ries et al. |
| 2002/0021064 A1 | 2/2002 | Devoe et al. |
| 2002/0042344 A1 | 4/2002 | Kondo et al. |
| 2002/0067789 A1 | 6/2002 | Wallace et al. |
| 2002/0076491 A1 | 6/2002 | Delperier et al. |
| 2002/0088714 A1 | 7/2002 | Motoi et al. |
| 2003/0054149 A1 | 3/2003 | Pan |
| 2003/0091788 A1 | 5/2003 | Schroder et al. |
| 2003/0118728 A1 | 6/2003 | Sion et al. |
| 2003/0138560 A1 | 7/2003 | Zhao et al. |
| 2003/0205203 A1 | 11/2003 | Sion et al. |
| 2004/0028813 A1 | 2/2004 | Thebault et al. |
| 2004/0045932 A1 | 3/2004 | Kochergin et al. |
| 2004/0083967 A1 | 5/2004 | Yuda et al. |
| 2004/0087168 A1 | 5/2004 | Granneman et al. |
| 2004/0134879 A1 | 7/2004 | Kochergin et al. |
| 2004/0253377 A1 | 12/2004 | Bok et al. |
| 2004/0255843 A1 | 12/2004 | Yoshida et al. |
| 2005/0082007 A1 | 4/2005 | Nguyen et al. |
| 2005/0133166 A1 | 6/2005 | Satitpunwaycha et al. |
| 2006/0046059 A1 | 3/2006 | Arico et al. |
| 2006/0062910 A1 | 3/2006 | Meiere |
| 2006/0096911 A1 | 5/2006 | Brey et al. |
| 2006/0193979 A1 | 8/2006 | Meiere et al. |
| 2006/0263525 A1 | 11/2006 | Sion et al. |
| 2007/0031609 A1 | 2/2007 | Kumar et al. |
| 2007/0131849 A1 | 6/2007 | Beaulieu et al. |
| 2007/0217119 A1 | 9/2007 | Johnson et al. |
| 2007/0259130 A1 | 11/2007 | Von Kaenel et al. |
| 2007/0264840 A1 | 11/2007 | Itatani et al. |
| 2008/0066684 A1 | 3/2008 | Patalay et al. |
| 2008/0069951 A1 | 3/2008 | Chacin et al. |
| 2008/0113097 A1 | 5/2008 | Mahajani et al. |
| 2008/0124462 A1 | 5/2008 | Waghray et al. |
| 2008/0223795 A1 | 9/2008 | Bakajin et al. |
| 2008/0237919 A1 | 10/2008 | Liu et al. |
| 2008/0241503 A1 | 10/2008 | Romdhane et al. |
| 2008/0286448 A1 | 11/2008 | Elam et al. |
| 2009/0137043 A1 | 5/2009 | Parsons et al. |
| 2009/0194233 A1 | 8/2009 | Tamura et al. |
| 2009/0206057 A1 | 8/2009 | Huang et al. |
| 2009/0212680 A1 | 8/2009 | Tremsin et al. |
| 2009/0215211 A1 | 8/2009 | Tremsin et al. |
| 2009/0315443 A1 | 12/2009 | Sullivan et al. |
| 2009/0324829 A1 | 12/2009 | Dalton et al. |
| 2010/0044577 A1 | 2/2010 | Sullivan et al. |
| 2010/0068132 A1 | 3/2010 | Vencill et al. |
| 2010/0075131 A1 | 3/2010 | Etzel et al. |
| 2010/0075445 A1 | 3/2010 | Beaulieu et al. |
| 2010/0075560 A1 | 3/2010 | Seshadri et al. |
| 2010/0080841 A1 | 4/2010 | Porbeni et al. |
| 2010/0093527 A1 | 4/2010 | Hasselmann |
| 2010/0178468 A1 | 7/2010 | Jiang et al. |
| 2010/0189900 A1 | 7/2010 | Dickey et al. |
| 2011/0135842 A1 | 6/2011 | Faguet et al. |
| 2011/0220802 A1 | 9/2011 | Frisch et al. |
| 2011/0229838 A1 | 9/2011 | Kalgutkar et al. |
| 2011/0250354 A1 | 10/2011 | Pallem et al. |
| 2011/0253046 A1 | 10/2011 | Dalton et al. |
| 2011/0268624 A1 | 11/2011 | Chandler et al. |
| 2012/0000886 A1 | 1/2012 | Honda et al. |
| 2012/0070794 A1 | 3/2012 | Craig et al. |
| 2012/0171376 A1 | 7/2012 | Dodge |
| 2012/0171403 A1 | 7/2012 | Dodge |
| 2012/0187305 A1 | 7/2012 | Elam et al. |
| 2012/0308739 A1 | 12/2012 | Lansalot-Matras et al. |

(56) References Cited

U.S. PATENT DOCUMENTS

| | | |
|---|---|---|
| 2013/0001156 A1 | 1/2013 | Takeno |
| 2013/0014799 A1 | 1/2013 | Vidu et al. |
| 2013/0025538 A1 | 1/2013 | Collins et al. |
| 2013/0048629 A1 | 2/2013 | Kang et al. |
| 2013/0164456 A1 | 6/2013 | Winter et al. |
| 2013/0186452 A1 | 7/2013 | Argo et al. |
| 2013/0189810 A1 | 7/2013 | Argo et al. |
| 2013/0263776 A1 | 10/2013 | Pitney et al. |
| 2013/0280546 A1 | 10/2013 | Elam et al. |
| 2013/0335190 A1 | 12/2013 | Elam et al. |
| 2014/0106070 A1 | 4/2014 | Mantymaki et al. |
| 2014/0220244 A1 | 8/2014 | Mane et al. |
| 2014/0225091 A1 | 8/2014 | O'Carroll et al. |
| 2014/0272432 A1 | 9/2014 | Dodge et al. |
| 2015/0125599 A1 | 5/2015 | Lindfors et al. |
| 2018/0094352 A1 | 4/2018 | Mane et al. |
| 2018/0273550 A1 | 9/2018 | Gordon et al. |
| 2019/0379056 A1 | 12/2019 | Chen |

FOREIGN PATENT DOCUMENTS

| | | |
|---|---|---|
| GB | 1 163 979 A | 9/1969 |
| JP | 2000-182979 A | 6/2000 |
| JP | 2001-247970 A | 9/2001 |
| JP | 2005-306625 A | 11/2005 |
| JP | 2007-277105 A | 10/2007 |
| WO | WO-2009/045752 A2 | 4/2009 |
| WO | WO-2011/037798 A1 | 3/2011 |
| WO | WO-2011/037831 A2 | 3/2011 |
| WO | WO-2011/122059 A1 | 10/2011 |
| WO | WO-2012/099658 A2 | 7/2012 |
| WO | WO-2013/045788 A1 | 4/2013 |
| WO | WO-2013/066749 A1 | 5/2013 |
| WO | WO-2013/140021 A1 | 9/2013 |
| WO | WO-2013/171360 A1 | 11/2013 |
| WO | WO-2016/037656 A1 | 3/2016 |

OTHER PUBLICATIONS

Ahmed, et al., "Electrode surface engineering by atomic layer deposition: A promising pathway toward better energy storage," Nano Today 11(2), pp. 250-271 (2016).

Andres, et al., "Decoupling of optoelectronic properties from morphological changes in sodium treated kesterite thin film solar cells," Solar Energy 175, pp. 94-100 (2018).

Attenkofer, et al., "A New Approach to Photocathode Development: From the Recipe to Theory Inspired Design," 6th International Conference on New Developments in Photon Detection, retrieved from http://lappddocs.uchicago.edu/documents/200 15 pages (2011).

Biemolt, et al., "Beyond Lithium-Based Batteries," Materials 13(2), 425, 31 pages (2020).

Binions, et al., "Aerosol-assisted chemical vapour deposition of sodium fluoride thin films," Thin Solid Films 469-470, pp. 416-419 (2004).

Bjorck & Andersson, "GenX: an extensible X-ray reflectivity refinement program utilizing differential evolution," Journal of Applied Crystallography 40(6), pp. 1174-1178 (2007).

Brown, et al., "Improved flexibility with grayscale fabrication of calcium fluoride homogenizers," Proceedings of SPIE 8326, 11 pages (2012).

Byrum, "Development of Large Area Fast Microchannel Plate Photodetectors," SPIE 2011 Defense Security & Sensing, retrieved from http://lappddocs.uchicago.edu/documents/189, 35 pages (2011).

Chen, et al., "Novel ALD Chemistry Enabled Low-Temperature Synthesis of Lithium Fluoride Coatings for Durable Lithium Anodes," ACS Applied Materials & Interfaces 10(32), pp. 26972-26981 (2018).

Elagin, "Performance of Microchannel Plates Fabricated Using Atomic Layer Deposition," IEEE Symposium on Radiation Measurements and Applications, retrieved from http://lappddocs.uchicago.edu/documents/186, 15 pages (2012).

Elam, et al., "Conformal coating on ultrahigh-aspect-ratio nanopores of anodic alumina by atomic layer deposition," Chemistry of Materials 15(18), pp. 3507-3517 (2003).

Elam, et al., "Viscous Flow Reactor with Quartz Crystal Microbalance for Thin Film Growth by Atomic Layer Deposition," Review of Scientific Instruments 73(8), pp. 2981-2987 (2002).

Elam, et al., "ZnO/Al2O3 nanolaminates fabricated by atomic layer deposition: growth and surface roughness measurements," Thin Solid Films 414(1), pp. 43-55 (2002).

Ertley, et al., "Microchannel plate detectors for future NASA UV observatories," Proceedings of SPIE 10699, 13 pages (2018).

Faubert, et al., "Activation and characterization of Fe-based catalysts for the reduction of oxygen in polymer electrolyte fuel cells," Electrochimica Acta 43(14-15), pp. 1969-1984 (1998).

Feinauer, et al., "Unlocking the Potential of Fluoride-Based Solid Electrolytes for Solid-State Lithium Batteries," ACS Applied Energy Materials 2(10), pp. 7196-7203 (2019).

George, "Fabrication and Properties of Nanolaminates Using Self-Limiting Surface Chemistry Techniques," University of Colorado Department of Chemistry and Biochemistry, ADA415471, 21 pages (2003).

George, "Atomic layer deposition: an overview," Chemical Reviews 110(1), pp. 111-131 (2010).

Hwang, et al., "NaF—FeF2 nanocomposite: New type of Na-ion battery cathode material," Nano Research 10, pp. 4388-4397 (2017).

International Search Report & Written Opinion for PCT/US2011/064593 dated Jul. 11, 2012, 10 pages.

Ivanov, et al., "Simulation of gain and timing resolution in saturated pores," Nuclear Instruments and Methods in Physics Research Section A: Accelerators, Spectrometers, Detectors and Associated Equipment 639(1), pp. 158-161 (2011).

Iwahori, et al., "Optical properties of fluoride thin films deposited by RF magnetron sputtering," Applied Optics 45(19), pp. 4598-4602 (2006).

Jaouen, et al., "Cross-Laboratory Experimental Study of Non-Noble-Metal Electrocatalysts for the Oxygen Reduction Reaction", Applied Materials and Interfaces 1(8), pp. 1623-1639 (2009).

Jokela, et al., "Secondary Electron Yield of Emissive Materials for Large-Area Micro-Channel Plate Detectors: Surface Composition and Film Thickness Dependencies," Physics Procedia 37, pp. 740-747 (2012).

Kim, et al., "Synthesis of Calcium(II) Amidinate Precursors for Atomic Layer Deposition through a Redox Reaction between Calcium and Amidines," Angewandte Chemie 55(35), pp. 10228-10233 (2016).

Knisley, et al., "Precursors and chemistry for the atomic layer deposition of metallic first row transition metal films," Coordination Chemistry Reviews 257(23-24), pp. 3222-3231 (2013).

Ledinek, et al., "Effect of NaF pre-cursor on alumina and hafnia rear contact passivation layers in ultra-thin Cu(In, Ga)Se2 solar cells," Thin Solid Films 683, pp. 156-164 (2019).

Lee & George, "Atomic Layer Etching of Al2O3 Using Sequential, Self-Limiting Thermal Reactions with Sn(acac)2 and Hydrogen Fluoride," ACS Nano 9(2), pp. 2061-2070 (2015).

Lee, et al., "Atomic Layer Deposition of Metal Fluorides Using HF-Pyridine as the Fluorine Precursor," Chemistry of Materials 28(7), pp. 2022-2032 (2016).

Lefevre & Dodelet, "Fe-based catyalysts for the reduction of oxygen in polymer electrolyte membrane fuel cell conditions: determination of the amount of peroxide released during electroreduction and its influence on the stablity of the catalysts", Electrochimica Acta 48(19), pp. 2749-2760 (2003).

Lefevre, et al., "Iron-Based Catalysts with Imporved Oxygen Reduction Activity in Polymer Electrolyte Fuel Cells", Science 324(5923), pp. 71-74 (2009).

Li, et al., "Cation and anion immobilization through chemical bonding enhancement with fluorides for stable halide perovskite solar cells," Nature Energy 4, pp. 408-415 (2019).

Lingg, et al., "Sodium fluoride thin films by chemical vapor deposition," Thin Solid Films 209(1), pp. 9-16 (1992).

Liu, et al., "Toward 3D Solid-State Batteries via Atomic Layer Deposition Approach," Frontiers in Energy Research 6, 10, 5 pages (2018).

(56) References Cited

OTHER PUBLICATIONS

Luo, et al., "Na-Ion Battery Anodes: Materials and Electrochemistry," Accounts of Chemical Research 49(2), pp. 231-240 (2016).
Ma, et al., "Atomic Layer Deposition for Lithium-Based Batteries," Advanced Materials Interfaces 3(21), 1600564, 15 pages (2016).
Ma, et al., "Cobalt Imidazolate Framework as Precursor for Oxygen Reduction Reaction Electroatalysts," Chemistry: A European Journal 17(7), pp. 2063-2067 (2011).
Mahuli, et al., "Atomic layer deposition of aluminum oxyfluoride thin films with tunable stoichiometry," Journal of Vacuum Science & Technology A 38:022407, 10 pages (2020).
Mahurin, et al., "Atomic Layer Deposition of TiO2 on Mesoporous Silica," Journal of Non-Crystalline Solids 352(30-31), pp. 3280-3284 (2006).
Mane & Elam, "Atomic Layer Deposition of W:Al2O3 Nanocomposite Films with Tunable Resistivity," Chemical Vapor Deposition 19(4-6), pp. 186-193 (2013).
Mane & Elam, et al., "Nanostructured composite thin films with tailored resistivity by atomic layer deposition," Proceedings of SPIE 8818, 8 pages (2013).
Mane, et al., "A novel atomic layer deposition method to fabricate economical and robust large area microchannel plates for photodetectors," 2nd International Conference on Technology and Instrumentation in Particle Physics, retrieved from https://indico.cern.ch/event/102998/contributions/17033/attachments/10453, 28 pages (2011).
Mane, et al., "A novel atomic layer deposition method to fabricate economical and robust large area microchannel plates," Proceedings of SPIE 8031, 80312H, 7 pages (2011).
Mane, et al., "A novel atomic layer deposition method to fabricate economical and robust large area microchannel plates," SPIE Proceedings 8031, Micro- and Nanotechnology Sensors, Systems, and Applications III, 80312H, 7 pages (2011).
Mane, et al., "An Atomic Layer Deposition Method to Fabricate Economical and Robust Large Area Microchannel Plates for Photodetectors," Physics Procedia 37, pp. 722-732 (2012).
Mane, et al., "Atomic Layer Deposition of Nanostructured Tunable Resistance Coatings: Growth, Characterization, and Electrical Properties," ECS Transactions 64(9), pp. 3-14 (2014).
Mane, et al., "Creation of economical and robust large area MCPs by ALD method for photodetectors," Proceedings of SPIE 9968, 11 pages (2016).
Mantymaki, et al., "Metal Fluorides as Lithium-Ion Battery Materials: An Atomic Layer Deposition Perspective," Coatings 8(8), 277, 40 pages (2018).
Meng, et al., "Emerging Applications of Atomic Layer Deposition for Lithium-Ion Battery Studies," Advanced Materials 24(27), pp. 3589-3615 (2012).
Meng, et al., "SWCNT-Supported Amorphous Gallium Sulfide as a New High-Performance Anode for Lithium-Ion Batteries," 223rd Electrochemical Society Meeting, Abstract #388, 1 page (2013).
Minot, et al., "Pilot production and advanced development of large-area picosecond photodetectors," Proceedings of SPIE 9968, 14 pages (2016).
Mironova & Gradusova, "Measurements of the refractometric characteristics of optical materials in the 248-5000-nm spectral region," Journal of Optical Technology 79(2), pp. 112-115 (2012).
Necas & Klapetek, "Gwyddion: an open-source software for SPM data analysis," Open Physics 10(1), pp. 181-188 (2012).
Niskanen, et al., "Refractive index retrieval from transmittance measurements," Optik 127(14), pp. 5562-5567 (2016).
Oberla, et al., "A 4-Channel Waveform Sampling ASIC in 0.13 μm CMOS for front-end Readout of Large-Area Micro-Channel Plate Detectors," Physics Procedia 37, pp. 1690-1698 (2012).
Ostreng, et al., "Atomic layer deposition of sodium and potassium oxides: evaluation of precursors and deposition of thin films," Dalton Transactions 43, pp. 16666-16672 (2014).
Pham, et al., "Improved Hydrothermal Stability of Niobia-Supported Pd Catalysts," Applied Catalysis A: General 397(1-2), pp. 153-162, pp. 153-162 (2011).

Pilvi, et al., "Atomic layer deposition process with TiF4 as a precursor for depositing metal fluoride thin films," Applied Optics 47(13), pp. C271-C274 (2008).
Pilvi, et al., "Novel ALD Process for Depositing CaF2 Thin Films," Chemistry of Materials 19(14), pp. 3387-3392 (2007).
Pu, et al., "Recent Progress in Rechargeable Sodium-Ion Batteries: toward High-Power Applications," Small 15(32), 1805427, 33 pages (2019).
Putkonen, et al., "Atomic layer deposition of metal fluorides through oxide chemistry," Journal of Materials Chemistry 21(38), pp. 14461-14465 (2011).
Rajan, et al., "Impact of Post-Deposition Recrystallization by Alkali Fluorides on Cu(In,Ga)Se2 Thin-Film Materials and Solar Cells," Thin Solid Films 690, 137526, 5 pages (2019).
Ritala, et al., "Rapid Coating of Through-Porous Substrates by Atomic Layer Deposition," Chemical Vapor Deposition 12(11), pp. 655-658 (2006).
Samuels, et al., "Chemical Vapor Deposition of Metal Fluorides Using Sodium and Zirconium Fluoroalkoxides," Chemistry of Materials 6(1), pp. 1684-1692 (1994).
Sang, et al., "Suppression in the electrical hysteresis by using CaF2 dielectric layer for p-GaN MIS capacitors," Journal of Applied Physics 123, 161423 (2018).
Schroeder, et al., "Epitaxial growth of laminar crystalline silicon on CaF2," Applied Physics Letters 77(9), 1289-1291 (2000).
Seh, et al., "A Highly Reversible Room-Temperature Sodium Metal Anode," ACS Central Science 1(8), pp. 449-455 (2015).
Shi, et al., "Structure and electrochemical performance of CaF2 coated LiMn1/3Ni1/3Co1/3O2 cathode material for Li-ion batteries," Electrochimica Acta 83, pp. 105-112 (2012).
Siegmund, "Ultrafast Large Area Vacuum Detectors: Part I," Seminario Nazionale Rivelatori Innovativi, retrieved from https://agenda.infn.it/event/4542/contributions/53649/attachments/38415/, 37 pages (2012).
Siegmund, "Ultrafast Large Area Vacuum Detectors: Part II," Seminario Nazionale Rivelatori Innovativi, retrieved from https://agenda.infn.it/event/4542/contributions/53652/attachments/38399/, 43 pages (2012).
Siegmund, et al., "Advances in microchannel plates and photocathodes for ultraviolet photon counting detectors," SPIE Proceedings 8145, 81450J, 12 pages (2011).
Siegmund, et al., "Advances in Microchannel Plates for Sealed Tube Detectors," LIGHT 11: Workshop on the Latest Developments of Photon Detectors, retrieved from http://lappddocs.uchicago.edu/documents/201, 17 pages (2011).
Siegmund, et al., "Atomic Deposited Borosilicate Glass Microchannel Plates for Large Area Event Counting Detectors," 6th International Conference on New Developments in Photon Detection, retrieved from http://lappddocs.uchicago.edu/documents/199, 15 pages (2011).
Siegmund, et al., "Atomic layer deposited borosilicate glass microchannel plates for large area event counting detectors," Nuclear Instruments and Methods in Physics Research Section A: Accelerators, Spectrometers, Detectors and Associated Equipment 695, pp. 168-171 (2012).
Siegmund, et al., "Development of Large Area Photon Counting Detectors Optimized for Cherenkov Light Imaging with High Temporal and sub-mm Spatial Resolution," 2011 IEEE Nuclear Science Symposium Conference Record, retrieved from http://lappddocs.uchicago.edu/documents/202, 8 pages (2011).
Siegmund, et al., "Large Area Photodetector Development Project at Space Sciences Laboratory (SSL)," SLAC National Accelerator Laboratory, retrieved from http://lappddocs.uchicago.edu/documents/195, 28 pages (2009).
Siegmund, et al., "Microchannel plate detector technology potential for LUVOIR and HabEx," Proceedings of SPIE 10397, 14 pages (2017).
Sonsteby, et al., "Atomic layer deposition of (K, Na)(Nb, Ta)O3 thin films," Journal of Vacuum Science & Technology A 34, 041508, 7 pages (2016).
Sonsteby, et al., "Chemical Uniformity in Ferroelectric KxNa1—xNbO3 Thin Films," Global Challenges 3(10), 1800114, 6 pages (2019).

(56) References Cited

OTHER PUBLICATIONS

Sonsteby, et al., "tert-butoxides as precursors for atomic layer deposition of alkali metal containing thin films," Journal of Vacuum Science & Technology A 38, 060804, 15 pages (2020).

Sumiya, et al., "Initial growth stages of CaF2 on Si(111) investigated by scanning tunneling microscopy," Applied Surface Science 156(1-4), pp. 85-96 (2000).

Tong, et al., "Nanoclusters of MoO3-x embedded in an Al2O3 matrix engineered for customizable mesoscale resistivity and high dielectric strength," Applied Physics Letters 102, 252901, 5 pages (2013).

Wagner, "Development of a Lower Cost Large Area Microchannel Plate Photodetector," Workshop on the Latest Developments of Photon Detectors, retrieved from http://lappddocs.uchicago.edu/documents/205, 25 pages (2011).

Walter, et al., "Challenges and benefits of post-lithium-ion batteries," New Journal of Chemistry 44, pp. 167-1683 (2020).

Wetstein, et al., "Systems-Level Characterization of Microchannel Plate Detector Assemblies, using a Pulsed sub-Picosecond Laser," Physics Procedia 37, pp. 748-756 (2012).

Wind, et al., "Nucleation period, surface roughness, and oscillations in mass gain per cycle during W atomic layer deposition on Al2O3," Journal of Applied Physics 105, 074309, 13 pages (2009).

Wu, et al., "Guidelines and trends for next-generation rechargeable lithium and lithium-ion batteries," Chemical Society Reviews 49(5), pp. 1569-1614 (2020).

Wu, et al., "High-Performance Electrocatalysts for Oxygen Reduction Derived from Polyaniline, Iron, and Cobalt," Science 332(6028), pp. 443-447 (2011).

Ylilammi & Ranta-Aho, "Metal Fluoride Thin Films Prepared by Atomic Layer Deposition," Journal of the Electrochemical Society 141(5), pp. 1278-1284 (1994).

Yu, et al., "Electrode Engineering by Atomic Layer Deposition for Sodium-Ion Batteries: From Traditional to Advanced Batteries," Advanced Functional Materials 30(9), 1906890, 28 pages (2020).

Zhao, et al., "Addressing Interfacial Issues in Liquid-Based and Solid-State Batteries by Atomic and Molecular Layer Deposition," Joule 2(12), pp. 2583-2604 (2018).

Zuo, et al., "Recent progress in surface coating of cathode materials for lithium ion secondary batteries," Journal of Alloys and Compounds 706, pp. 24-40 (2017) (68 page accepted manuscript provided).

* cited by examiner

BARRIER COATINGS

STATEMENT OF GOVERNMENT INTEREST

This invention was made with government support under Contract No. DE-ACO2-06CH11357 awarded by the United States Department of Energy to UChicago Argonne, LLC, operator of Argonne National Laboratory. The government has certain rights in the invention.

TECHNICAL FIELD

The present disclosure relates to microchannel plates and, in particular, to a process of atomic layer deposition using functionalized substrates to provide improved secondary electron emission materials.

BACKGROUND

An electron amplifier structure or an electron multiplier may be used as a component in a detector system to detect low levels of electrons, ions, or photons, and provide an amplified response via a plurality of secondary electron emissions. Conventional electron amplifier structures, such as channeltrons (single channel tubes) and microchannel plates ("MCPs," 2D arrays of micro channels), are generally fabricated using various types of glass such as lead glass. During fabrication, these electron amplifier structures are created via a hydrogen annealing treatment referred to as "hydrogen firing" that causes the formation of reduced lead oxide ($PbO_x$) on the exposed surfaces of the channels and imparts electrical conductivity and secondary electron emissive properties.

Secondary electron emissive properties can also be imparted to MCPs using thin film coatings. Previously, thin film coatings of $Al_2O_3$ and MgO have been prepared on the exposed surfaces of MCP channels using a variety of thin film deposition techniques including atomic layer deposition.

It is desirable for a MCP being used as an electron multiplier to have a high, stable gain. MCPs with these properties are useful in a wide range of applications, including night vision, large area photodetectors, neutron sensing devices, and medical imaging. This gain is, at least in part, dictated by certain properties and features of the MCP. For example, secondary electron yield ("SEY") of the surfaces inside the MCP channels have a significant impact in dictating the gain. MgO SEY layers prepared by atomic layer deposition have a large SEY value of ~7.

The SEY itself is greatly impacted by factors such as the adsorption of molecules from the ambient environment, such as water or carbon dioxide. This is particularly impactful where the MCP may be exposed to extended processing, such as exposure outside of a high vacuum environment. MgO SEY coatings are particularly susceptible to ambient exposure. The MgO can form hydroxides and carbonates upon exposure to water and carbon dioxide. These hydroxides and carbonates have a lower SEY value compared to MgO and this reduces the MCP gain. Further, the SEY can be impacted by thermal annealing of the MCP. Such thermal annealing can result in solid state diffusion of elements. This results in a critical limitation on the processing options for a wide range of MCPs where thermal annealing is required to achieve stable operation. In addition, certain classes of MCPs may exhibit undesirable properties due to the presence of contaminants on or in the inner surface of the MCPs. Thus, there is a need for a process to produce MCPs with a stable structure to provide for a desired SEY without the deleterious impact of contaminants.

SUMMARY

At least one embodiment relates to a method of forming a secondary electron emissive ("SEE") coating. A substrate is provided within an atomic layer deposition ("ALD") reactor. A coating of $CaF_2$ is deposited by atomic layer deposition process including at least one cycle of: pulsing a first metal precursor comprising an alkaline metal amidinate into the reactor for a first metal precursor pulse time; purging the reactor of the first metal precursor; pulsing a second precursor comprising a fluorinated compound into the reactor for a second precursor pulse time; and purging the reactor of the co-reactant precursor. The depositing occurs at a reaction temperature greater than a highest sublimation temperature of the first metal precursor and the fluorinated compound and less than 50° C. below the smallest thermal decomposition temperature of the first metal precursor and the fluorinated compound.

Another embodiment relates to a method of forming an electron amplifier. An electron amplifier substrate having an emissive layer and a resistive layer is provided within an ALD reactor. A coating of $CaF_2$ is deposited by atomic layer deposition process including at least one cycle of: pulsing a first metal precursor comprising $[Ca(amd)_2]_2$ into the reactor for a first metal precursor pulse time; purging the reactor of the first metal precursor; pulsing a second precursor selected from the group consisting of hydrogen fluoride ("HF"), HF-pyridine ("HF-Py"), $WF_6$, $TaF_5$, $MoF_6$, and $NbF_5$ into the reactor for a second precursor pulse time; and purging the reactor of the second precursor.

Another embodiment relates to an electron detector device comprising a microchannel plate having a plurality of channels extending there through. A resistive coating is deposited on the microchannel plate. The device further includes an emissive layer deposited on the resistive layer; the emissive layer comprising $CaF_2$.

This summary is illustrative only and is not intended to be in any way limiting. Other aspects, inventive features, and advantages of the devices or processes described herein will become apparent in the detailed description set forth herein, taken in conjunction with the accompanying figures, wherein like reference numerals refer to like elements.

BRIEF DESCRIPTION OF THE FIGURES

Before turning to the figures, which illustrate certain exemplary embodiments in detail, it should be understood that the present disclosure is not limited to the details or methodology set forth in the description or illustrated in the figures. It should also be understood that the terminology used herein is for the purpose of description only and should not be regarded as limiting.

FIG. 3A illustrates the XPS data for MgO/WAlOF as deposited, and FIG. 3B illustrates the XPS data for the deposited material of FIG. 3A after annealing in nitrogen at 400° C., indicating $MgO_xF_y$ illustrating the diffusion of F from the WAlOF into the MgO

FIG. 5A illustrates the XPS data for MgO/WAlOF after annealing in nitrogen at 400° C., and FIG. 5B illustrates the XPS data for W:AlOF and MgO layers with an $Al_2O_3$ interlayer after annealing in nitrogen at 400° C.

FIG. 6A illustrates the XPS data for as-deposited $MgO/CaF_2$, and FIG. 6B illustrates the XPS data for $MgO/CaF_2$ after annealing in nitrogen at 400° C.

FIG. 7A illustrates the XPS data for as-deposited $WAlOF/CaF_2$, and FIG. 7B illustrates the XPS data for $W:AlOF/CaF_2$ after annealing in nitrogen at 400° C.

FIG. 8A shows measurements for MgO exposed to water, FIG. 8B shows MgO exposed to carbon dioxide, FIG. 8C shows $CaF_2$ exposed to water, and FIG. 8D shows $CaF_2$ exposed to carbon dioxide.

FIG. 9A shows the $MgO_xF_y$ layer as deposited at 200° C., while FIG. 9B shows the $MgO_xF_y$ layer after 400° C. annealing.

DETAILED DESCRIPTION

Microchannel plates may be manufactured by a range of processes. In one approach, a conformal deposition technique is utilized to deposit a material on a substrate. Various deposition techniques have been used, including molecular-beam epitaxy ("MBE"), electron beam evaporation ("EBE"), physical vapor deposition ("PVD"), thermal evaporation, pulsed laser deposition ("PLD"), and chemical vapor deposition ("CVD"). Recently, ALD has been utilized for MCP materials. ALD typically utilizes temperatures above room temperature, often above 200° C., although recent research has shown sub–200° C. ALD deposition for MCPs.

Figure 1:
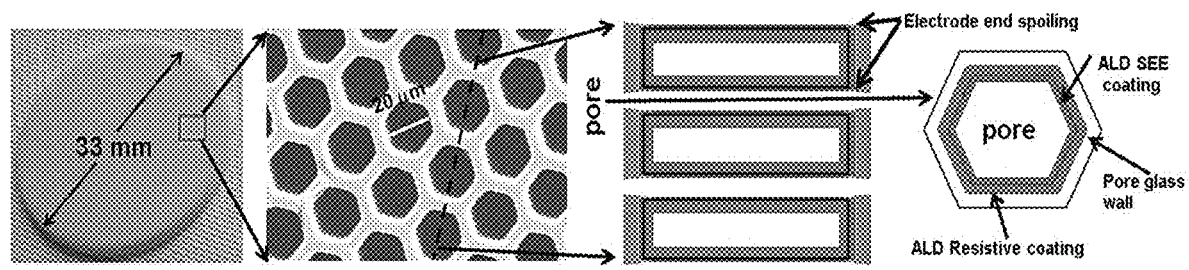
FIG. 1 illustrates one embodiment of a capillary glass array type substrate and the structure of the resistive and emissive layers for forming an electron amplifier.
Figure 2:
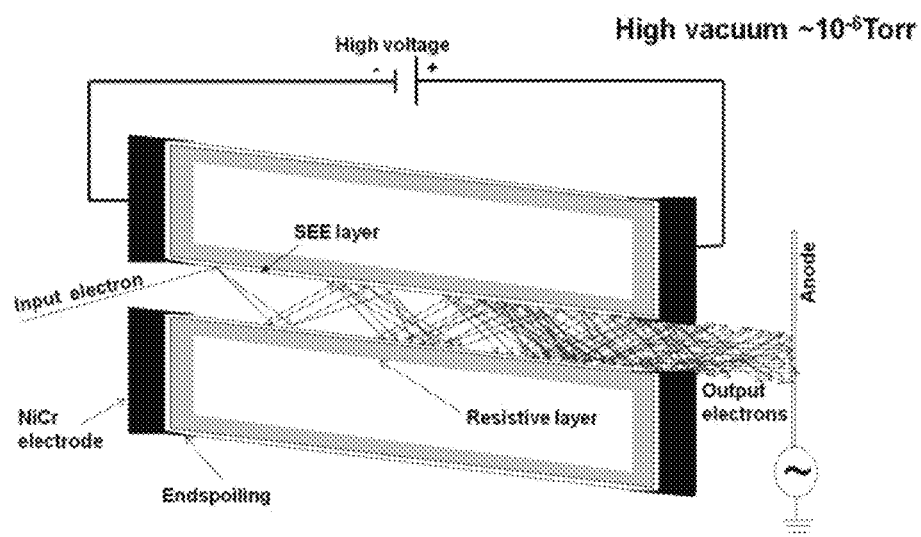
FIG. 2 illustrates the function of an electron amplifier having a SEE layer and a resistive layer.

MCPs may have a structure of a porous substrate coated with a secondary emission coating. As shown in FIG. 1, the structure may include a substrate, such as a porous glass substrate, with a resistive coating conformally coated within the pores and having conformally coated there a SEE coating. The MCP also typically has metal electrodes, such as a nickel-chromium alloy (NiCr), deposited on the front and back faces by PVD as shown in FIG. 2.

As previously noted, several commonly used structures for SEE materials exhibit undesirable characteristics, notably changes in the emissive layer through exposure to environmental materials such as reaction with water or carbon dioxide vapors or by migration of elements from the resistive layer, such as fluorine.

Figure 3A:
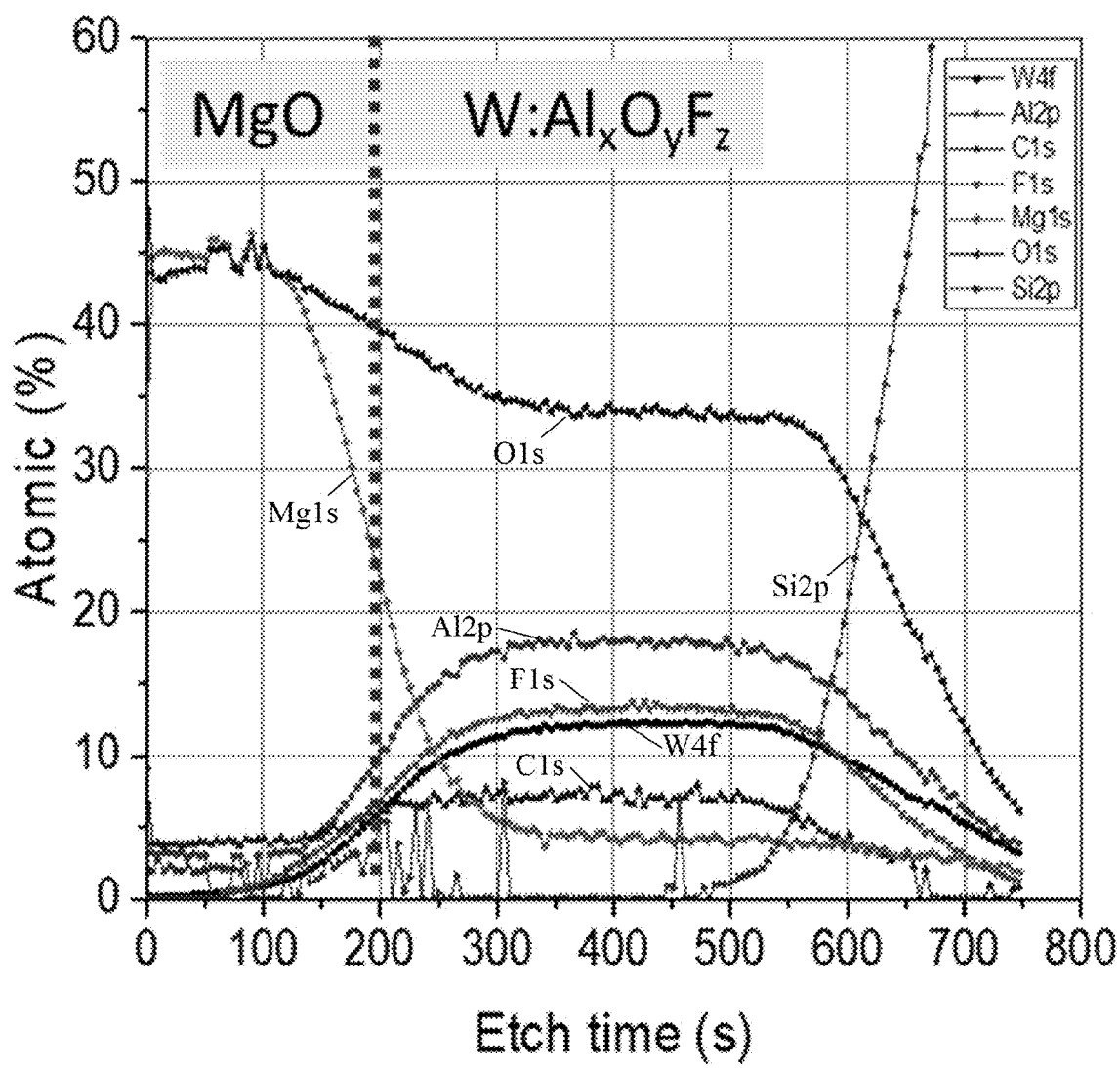
FIGS. 3A-3B show x-ray photoelectron spectroscopy ("XPS") depth profile measurements of ALD films.
Figure 3B:
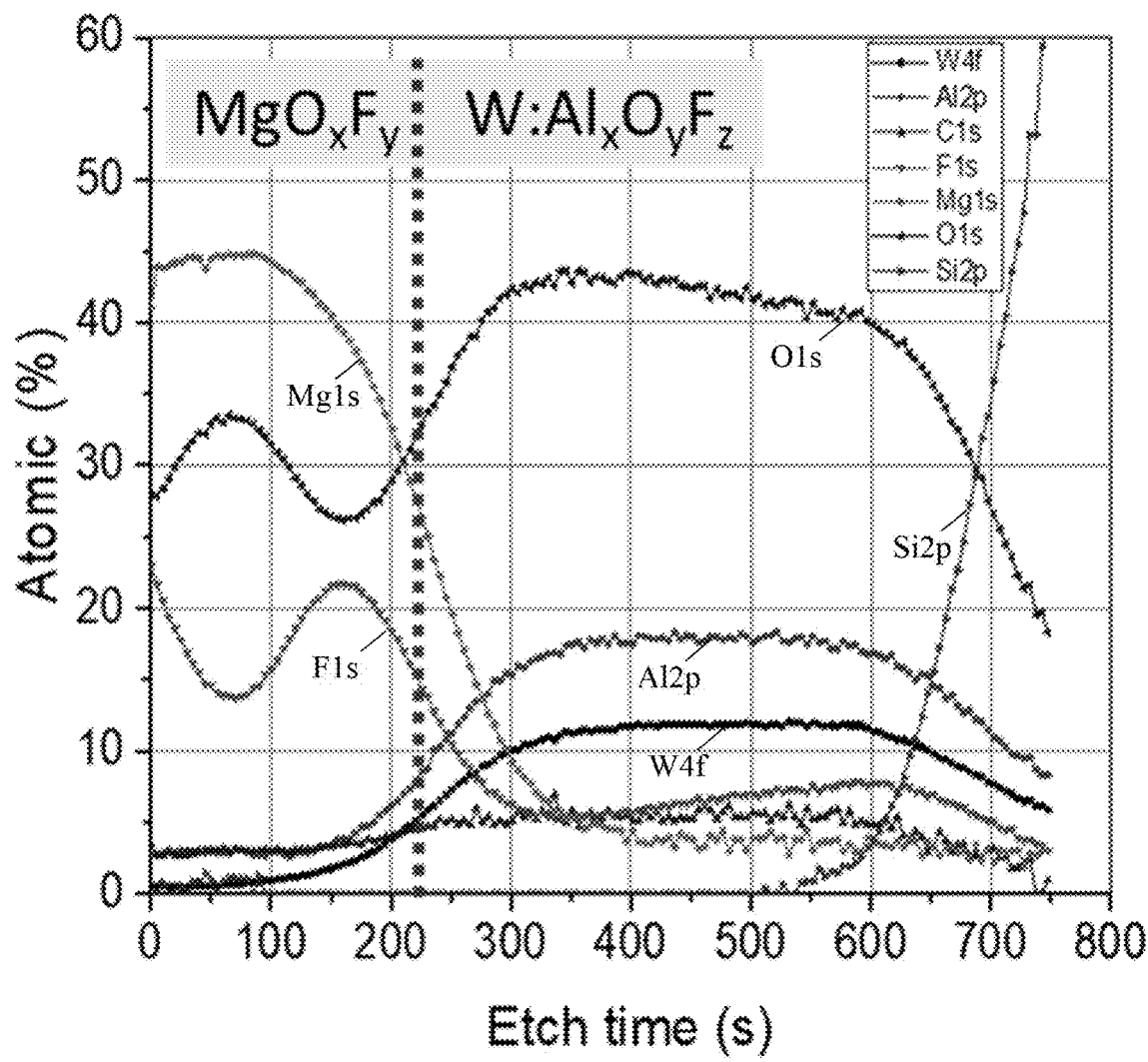

FIGS. 3A-3B show x-ray photoelectron spectroscopy ("XPS") depth profile measurements of ALD films. The ALD films comprise an ALD WAlOF resistive layer and an MgO SEE layer on a Si substrate. FIG. 3A illustrates the XPS depth profiling data for MgO/WAlOF as deposited, and FIG. 3B illustrates the XPS data for the deposited material of FIG. 3A after annealing in nitrogen at 400° C., indicating $MgO_xF_y$. As can be seen in the results illustrated in FIGS. 3A-3B, the fluorine of the resistive W:AlOF layer is seen to migrate into the emissive layer, forming $MgO_xF_y$. Fluorine migration is believed to occur from resistive coatings, such as those containing AlOF, such as W:AlOF, due to solid phase reactions between the reactive layer and the emissive layer. For example, the reaction of MgO and $AlF_3$ is spontaneous and will result in $MgF_2$ formation. The fluorine migration can change the resistance of the resistive layer such that the MCP device no longer meets device requirements. The fluorine migration can also change the secondary electron yield of the SEY layer leading to low gain and unstable operation. The extent of F-mitigation is dictated by the annealing temperature and duration. Typical annealing temperatures are 300-450° C. and annealing times are 1-10 hours. The annealing is used to drive off adsorbed moisture and other surface and bulk contaminants.

Figure 4A:
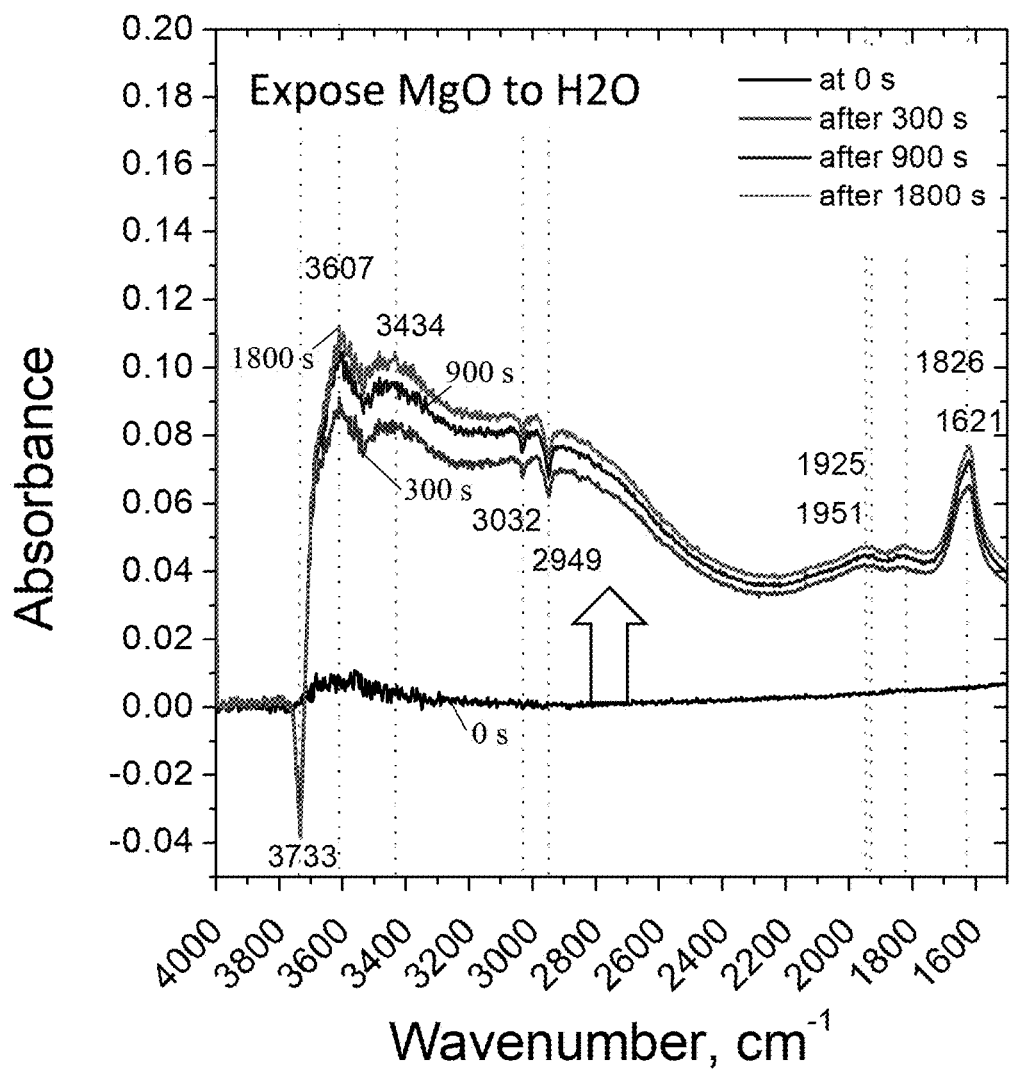
FIGS. 4A-4B show the infrared absorption spectroscopy ("IR Spec") measurements for MgO film exposed to water vapor (FIG. 4A) and for MgO exposed to carbon dioxide vapor (FIG. 4B). Similar to the issue noted with regard to fluorine, some emissive layer materials, such as MgO, are reactive with ambient environments, such as with carbon dioxide vapor and water vapor.
Figure 4B:
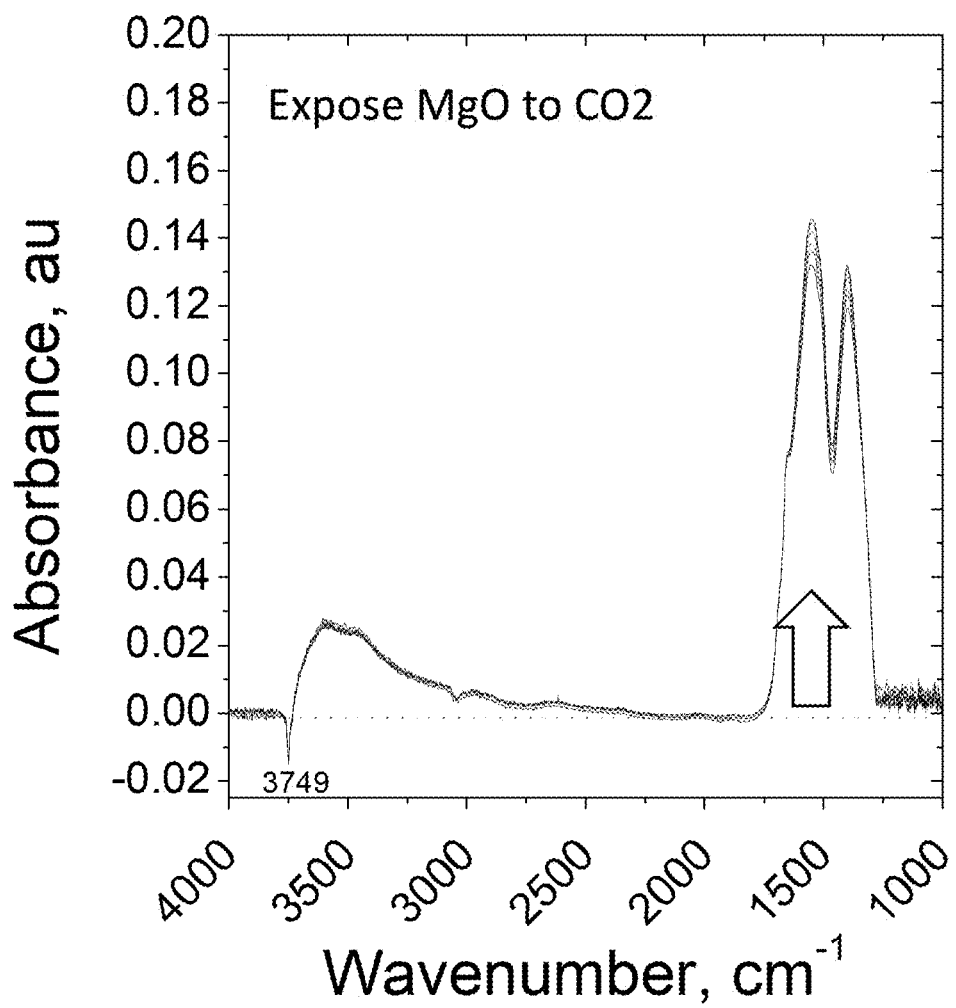

FIGS. 4A-4B show the IR Spec measurements for MgO film exposed to water vapor (FIG. 4A) and for MgO exposed to carbon dioxide vapor (FIG. 4B). Similar to the issue noted with regard to fluorine, some emissive layer materials, such as MgO, are reactive with ambient environments, such as with carbon dioxide and water in the air. Experiments indicated the formation of Mg hydrates and Mg carbonates by the respective exposures. These Mg hydrates and Mg carbonates have different SEE properties compared to MgO and can lead to unsatisfactory device operation.

Mitigation of the issued noted with MgO as a SEE component can accomplished through several embodiments. In some embodiments a coating that is resistant to fluorine migration may be used as a barrier layer, for example the barrier layer may be an emissive layer and/or an interlayer. Further, the barrier layer may form an interlayer that is a part of an electron amplifier positioned between an emissive layer and a resistive layer. In one embodiment, an $Al_2O_3$ interlayer is formed between a fluorine containing resistive layer, such as W:AlOF, and MgO as the emissive layer. In another embodiment, a $CaF_2$ interlayer is formed between a fluorine containing resistive layer, such as W:AlOF, and MgO as the emissive layer. In one embodiment, a SEE material includes a $MgO_xF_y$ oxyfluoride SEE layer. In another embodiment, a SEE material includes a $MgO/TiO_2$ mixed oxide SEE layer.

In some embodiments, ALD is utilized. In its simplest form, ALD is a sequence of two half-reactions or half-cycles, where, in a first half-cycle, a first precursor is pulsed or dosed such that it binds to the surface of the material to be coated (adsorption), the first precursor is purged, and then, in a second half-cycle, a second precursor (or co-reactant) is pulsed or dosed to react with the adsorbed/bound intermediate entity formed by the first precursor. The reaction of the second precursor with the first adsorbed entity forms a deposited material.

It should be appreciated that more complicated ALD schemes can be constructed as a super-cycle comprising various sub-cycles for depositing a material as described or for depositing multiple different materials for multiple dopants or formation of bi- (tri-, etc.) metallic materials, such as varying the parameters for any of the individual steps within a cycle. In one embodiment, the deposition may be a doped layer, a multi-layer, or a mixed metal composite. The respective pulse and purge times may be the same time or may be different for the different metal precursors and co-reactants.

In one embodiment, an $Al_2O_3$ barrier layer, such as an interlayer, is formed between W:AlOF and MgO layers. The $Al_2O_3$ layer may be deposited by ALD.

In one embodiment, the W:AlOF layer(s) is deposited by ALD using a ratio of 1 W ALD cycle to 8 $Al_2O_3$ ALD cycles and may comprising up to 500 total ALD cycles. The W:$Al_2O_3$ ratio may be from 1:1 to 1:50 and the total ALD cycles may be from 2 to 5000. MgO may be formed as a single layer or comprise 100 layers. The ratio of W:AlOF to MgO may be from 5:1 to 5000:1. The $Al_2O_3$ layer formed there between may be in a ratio of 1:2 to 1:5000 to W:AlOF and 1:1 to 500:1 to MgO. The $Al_2O_3$ may comprise a single layer or up to 500 layers. The W:AlOF ALD precursors may be tungsten hexafluoride ($WF_6$) and disilane ($Si_2H_6$) for the conducting component and trimethyl aluminum ("TMA") and $H_2O$ for the insulating component. In some embodiments, the $Si_2H_6$ may be replaced with TMA. In other embodiments, the $WF_6$ is replaced with molybdenum hexafluoride ($MoF_6$) to create a Mo:AlOF resistive layer. The ALD temperature may be in the range of 20-350° C. and preferably 200° C. The pulse times may be in the range of 0.01-30 s and preferably is. The purge times may be in the range of 1-200 s and preferably 5 s. It should be appreciated that the precursor dose and purge time is based on the self-limiting behavior of the precursors. This can be varied in wide range from a few milliseconds to 100 s of seconds. Further if a longer dose time is utilized, the purge times may need to increase to avoid a CVD type reaction, which can result in non-uniformity and particle formation.

Figure 5A:
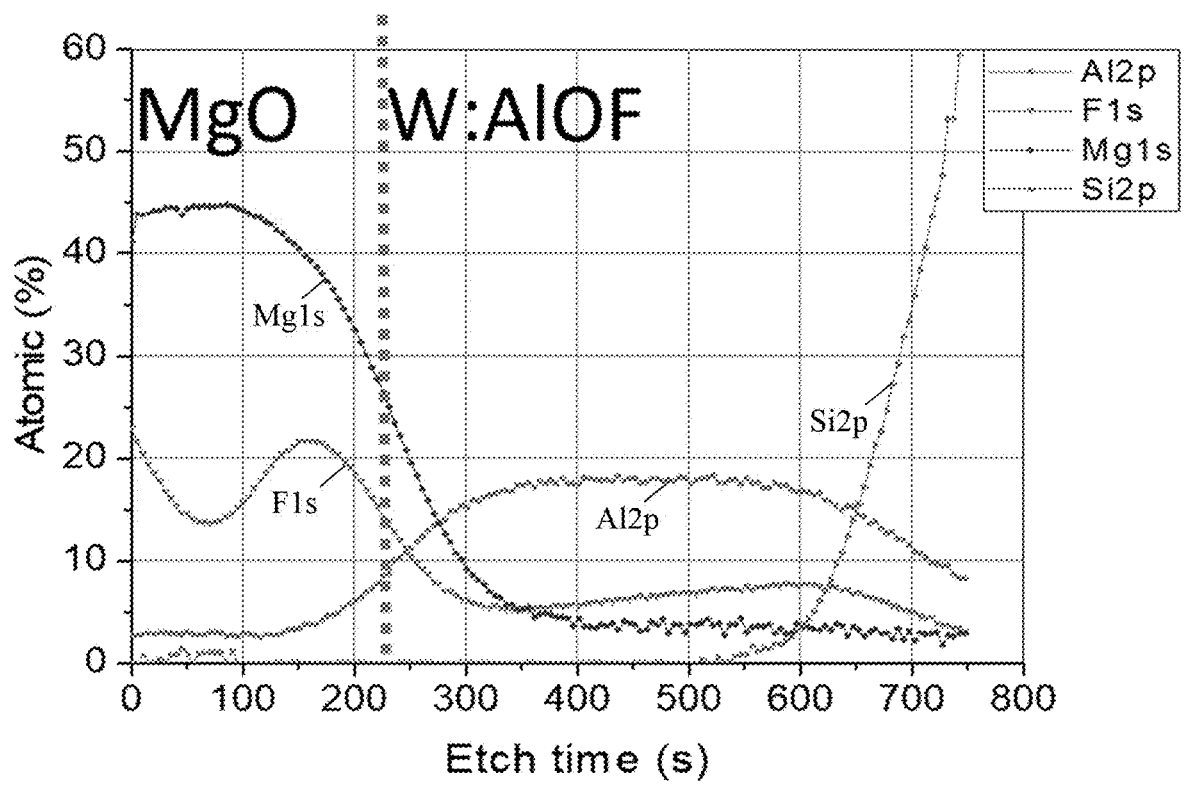
FIGS. 5A-5B show XPS depth profile measurements of ALD films.
Figure 5B:
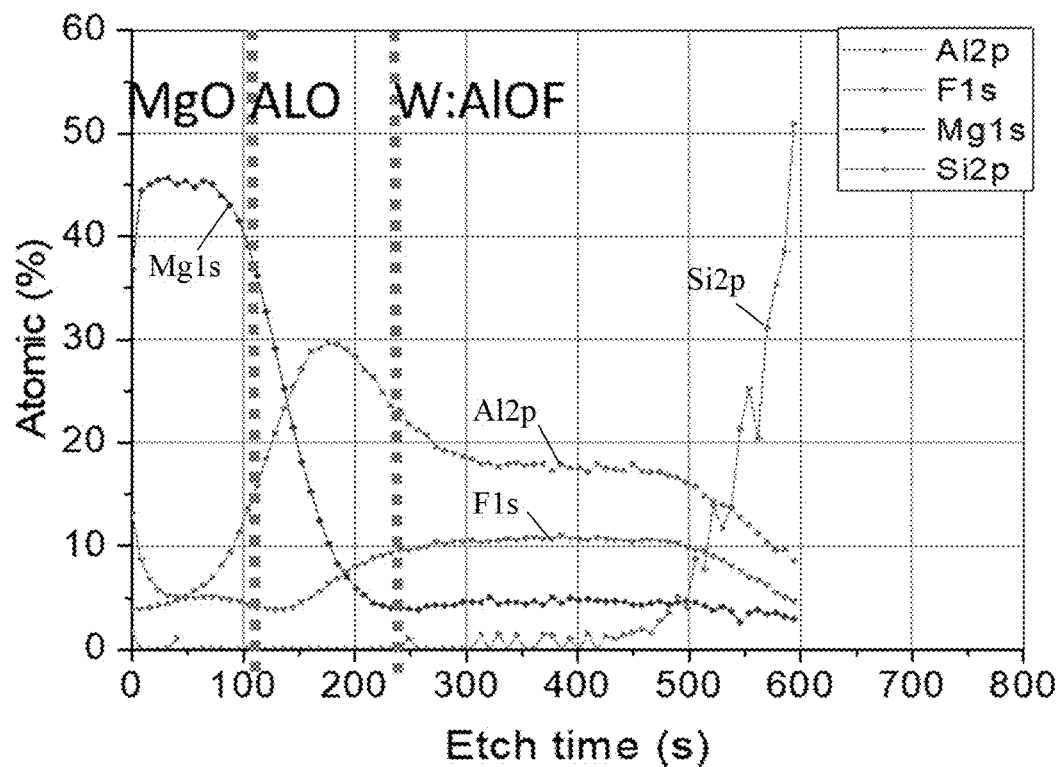

FIGS. 5A-5B show XPS depth profile measurements of ALD films. FIG. 5A illustrates the XPS data for MgO/WAlOF after annealing in nitrogen at 400° C., and FIG. 5B illustrates the XPS data for W:AlOF and MgO layers with an $Al_2O_3$ interlayer after annealing in nitrogen at 400° C. As can be seen in the results, the presence of the $Al_2O_3$ layer suppresses migration of the fluorine, notably reducing the amount of F observed in the MgO layers by a factor of 4-5.

In one embodiment, a $CaF_2$ barrier layer, such as an interlayer, is formed between resistive layers, such as W:AlOF, and emissive layers, such as MgO layers. The $CaF_2$ layer may be deposited by ALD.

The $CaF_2$ ALD process includes a first metal precursor. In one embodiment, the first metal precursor comprises an amidinate, such as calcium amidinate ($[Ca(amd)_2]_2$). The ALD process further includes a second precursor. The second precursor is reactive with the intermediate entity formed by the first metal precursor. The second precursor may be a fluorinated precursor. In some embodiments, the second precursor is selected from the group consisting of HF, HF-pyridine, $WF_6$, $TaF_5$, $MoF_6$, and $NbF_5$ In one embodiment, each ALD process consists of a cycle, which may be repeated to form a supercycle, with a first metal precursor vapor pulse, such as calcium amidinate ($[Ca(amd)_2]_2$) (e.g., for 3 seconds), for a first precursor exposure (e.g., for 3 seconds); followed by a first metal precursor purge (e.g., for 15 seconds), such as where the reactor is pumped to a vacuum; followed by a second precursor pulse, such as hydrogen fluoride (e.g., for 1 second), with a second precursor exposure (e.g., for 1 second); followed by a second precursor purge (e.g., for 10 seconds). It should be appreciated that the precursor dose and purge times are based on the self-limiting behavior of the precursors. This can be varied in wide range from a few milliseconds to tens of seconds. Further, if a longer dose time is utilized, the purge times may need to increase to avoid a CVD type reaction, which can result in non-uniformity and particle formation.

It should be appreciated that more complicated ALD schemes can be constructed as a super-cycle comprising various sub-cycles for depositing a material as described or for depositing multiple different materials for multiple dopants or formation of bi- (tri-, etc.) metallic materials, such as varying the parameters for any of the individual steps within a cycle. In one embodiment, the deposition may be a doped layer or a mixed metal composite.

The respective pulse and exposures may be the same time or pulse may be for a shorter time than the overall exposure.

In some embodiments, the first precursor is a vapor and the first precursor pulse comprises input to the reactor of a first precursor vapor for a first metal precursor pulse time of a few milliseconds to tens of seconds (e.g., 0.01, 0.05, 0.1, 0.5, 1, 5, 10, 20, or 30 seconds, inclusive of all ranges and values there between), such as 3 seconds. The first partial pressure of the first precursor pulse can be in the range of 0.01-1000 Torr (e.g., 10, 25, 50, 75, 100, 500, or 1000 Torr, inclusive of all ranges and values there between), such as, in one embodiment, at least 0.5-100 Ton, such as 0.88 Torr. One of skill in the art will appreciate that the time length, pressure, and amount of precursor for the pulse are all factors in determining the overall amount for each of those operation parameters. For example, the pressure and amount may follow from the duration of the pulse but depend on the size of the chamber and the type of valve as would be understood from general knowledge regarding ALD. The appropriate precursor pulse times will depend on the size, porosity, and number of substrates to be coated. Note, for ease of reference herein, the process is described with regard to the pulse duration, but it should be understood that the product of precursor partial pressure and time is what dictates the precursor exposures. A carrier gas, such as argon or other non-reactive (with the substrate, the resistive layer or the precursors) gas, may be used.

In some embodiments, the first precursor exposure comprises exposing the substrate to the first precursor for a first exposure time and a first partial pressure of the first metal precursor so that the first precursor binds with the substrate, a resistive layer deposited on the substrate previously, or coating from prior ALD cycle, including of $CaF_2$. In some embodiments, given the short time for the pulse/exposure for this ALD process the pulse lasts the entire exposure until the purge starts with the pulse time and exposure time being the same. The first metal precursor pulse time may be less than the first exposure time, or they may be equal such that the exposure is the same as the pulse. The first exposure time can be in the range of 0.05-500 seconds (e.g., 0.05, 0.1, 0.5, 1, 5, 10, 20, 30, 40, 50, 60, 70, 80, 90, 100, 120, 140, 160, 180, 200, 220, 240, 260, 280, 300, 350, 400, 450 or 500 seconds, inclusive of all ranges and values there between). In some embodiments, the first predetermined time is in the range of 1-10 seconds (e.g., about 3 seconds). The first partial pressure of the first metal precursor can be in the range of 0.01-10 Torr (e.g., 0.01, 0.05, 0.1, 0.5, 1.0, 5.0, or 10 Ton, inclusive of all ranges and values there between). In some embodiments, the first partial pressure of the first metal precursor is in the range of 0.1-1 Torr (e.g., about 0.88 Torr). A longer dose is needed for coating high surface area substrates.

The first precursor purge evacuates unreacted precursor from the reactor. The first precursor purge may be for a first precursor purge time of 0.5-30 seconds (e.g., 0.5, 1, 5, 10, 20, or 30 seconds, inclusive of all ranges and values there between), such as 15 seconds. The first precursor purge reduces the pressure in the reactor to within the range of 0.01-10 Torr (e.g., 0.01, 0.05, 0.1, 0.5, 1.0, 5.0, or 10 Torr, inclusive of all ranges and values there between), such as substantially to vacuum. In some embodiments, the reactor pressure may remain essentially constant during the first precursor purge, but a constant flow of inert carrier gas such as Argon sweeps away residual unreacted precursor from the reactor.

In some embodiments, the base material can be heated to a predetermined temperature during the ALD process. For example, the first predetermined temperature can be in the range of 20-200° C. (e.g., 20, 30, 40, 50, 60, 70, 80, 90, 100, 110, 120, 130, 140, 150, 160, 170, 180, 190 or 200° C., inclusive of all ranges and values there between). In some embodiments, the first predetermined temperature is in the range of 100-400° C. (e.g., 225° C.). Temperature also impacts the overall energy in the system and the performance for diffusion and/or reaction. In an ALD process, the deposition temperature range where more or less the same growth occurs is referred to as the "ALD window." The ALD reaction should occur at a temperature of the precursor sufficient to give constant precursors evaporation rate (i.e., vapor pressure). If vapor pressure is not enough, there may still be layer growth, but the surface coverage will be poor. If vapor pressure is too much, it will waste precursor, and there may be CVD growth if there is not sufficient purge time due to mixing of precursors. The temperature of the layer growth can be as low as the subliming temperature of the ALD precursors. For example, if precursor sublimes at 150° C. films can also grow around that temperature. But generally, layer growth temperature is 25-50° C. higher than precursor sublimation temperature. The temperature must be lower than the thermal decomposition temperature of the precursor.

The substrate, after reaction with the first metal precursor, is then exposed to a second precursor by a second precursor pulse introducing the second precursor to the reactor and then exposing for the second precursor exposure such that the second precursor reacts with the first metal precursor or, more particularly, with intermediate entity formed by the first metal precursor and the substrate (or ALD coating on the substrate).

In some embodiments, the second precursor pulse comprises input to the reactor of the second precursor vapor for a second precursor pulse time of 0.01-30 seconds (e.g., 0.01, 0.05, 0.1, 0.5, 1, 5, 10, 20, or 30 seconds, inclusive of all ranges and values there between), such as 1 second. The first partial pressure of the second precursor pulse can be in the range of 0.01-10 Torr (e.g., 0.01, 0.05, 0.1, 0.5, 1.0, 5.0, or 10 Torr, inclusive of all ranges and values there between) such as 0.88 Torr.

In some embodiments, exposing the substrate to second precursor for a second precursor exposure time and a second partial pressure of the second precursor so that second precursor reacts with the entity formed by the first metal precursor reacting with the substrate (or previous ALD deposited coatings). The second precursor exposure time can be in the range of 0.05-500 seconds (e.g., 0.05, 0.1, 0.5 1, 5, 10, 20, 30, 40, 50, 60, 70, 80, 90, 100, 120, 140, 160, 180, 200, 220, 240, 260, 280, 300, 350, 400, 450 or 500 seconds, inclusive of all ranges and values there between), such as about 1 second. The second partial pressure of the second precursor can be in the range of 0.01-10 Torr (e.g., 0.01, 0.05, 0.1, 0.5, 1.0, 5.0, or 10 Torr, inclusive of all ranges and values there between). In some embodiments, the second partial pressure of the second precursor is in the range of 0.1-1 Torr (e.g., about 0.5 Torr) such as 0.88 Torr.

The second precursor purge evacuates unreacted precursor from the reactor. The second precursor purge may be for a second precursor purge time of 0.5-500 seconds (0.5, 1, 5, 10, 20, 30, 40, 50, 60, 70, 80, 90, 100, 120, 140, 160, 180, 200, 220, 240, 260, 280, 300, 350, 400, 450 or 500 seconds, inclusive of all ranges and values there between), such as 10 seconds. The second precursor purge reduces the pressure in the reactor to within the range of 0.01-10 Torr (e.g., 0.01, 0.05, 0.1, 0.5, 1.0, 5.0, or 10 Ton, inclusive of all ranges and values there between), such as substantially to vacuum. In some embodiments, the reactor pressure may remain essentially constant during the second precursor purge, but a constant flow of inert carrier gas such as Argon sweeps away residual unreacted precursor from the reactor. In some embodiments, the second precursor may include one or more of HF, HF dissolved in pyridine, $WF_6$, $TaF_5$, $MoF_6$, $NbF_5$, and hexafluoroacetylacetone ("hfac").

Any number of cycles of exposing the substrate or prior coatings to the first metal precursor and the second precursor can be performed to reach a thickness of coating or to provide a desired alteration of the substrate properties. In some embodiments, the number of cycles of the ALD process can be in the range of 1-50 (e.g., 1 cycle, 2, 3, 4, 5, 10, 15, 20, 25, 30, 35, 40, 45, or 50 cycles, inclusive of all ranges and values there between). $CaF_2$ is an ionic crystal with the fluorite structure. The lattice is a face centered cubic ("FCC") structure with three sub-lattices. The unit cell of the material is most easily described as a simple cubic lattice formed by the $F^-$ ions where a $Ca^{2+}$ ion is contained in every second cube. The remaining empty cubes called as interstitial or hollow sites are important for defect formation and diffusion, but also for the accommodation of unwanted impurities like rare earth ions and dopants. The lattice constant is a=5.451 Å. The natural cleavage plane of the crystal is the (111) surface. It is built up from $F^-$—$Ca^{2+}$—$F^-$ triple layers of 3.14 Å distance and is terminated by fluorine ions. Consider the mass per steady state $CaF_2$ ALD cycle is 12 ng/cm$^2$ ($F^-$—$Ca^{2+}$—$F^-$) or growth rate is 0.3 Å/cycle; therefore, in one embodiment, the process is depositing a partial layer in each cycle of $CaF_2$. In one embodiment, the interlayer thickness is in the range of 0.3-30 nm. In some embodiments, the ALD deposition of the $CaF_2$ interlayer proceeds for 10-1000 cycles.

Figure 6A:
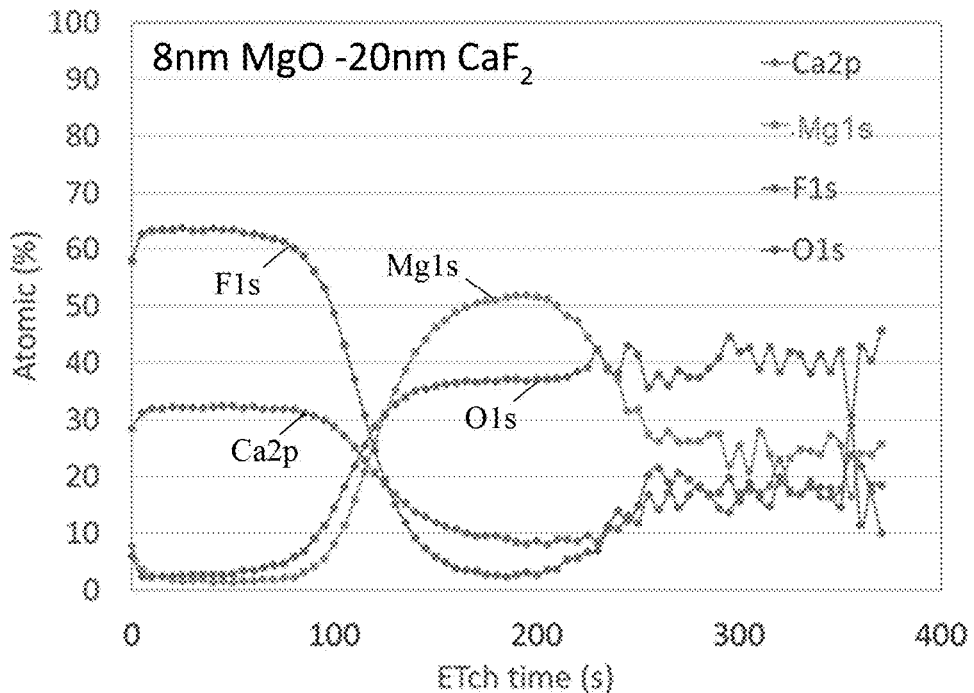
FIGS. 6A-6B show XPS depth profile measurements of ALD films.
Figure 6B:
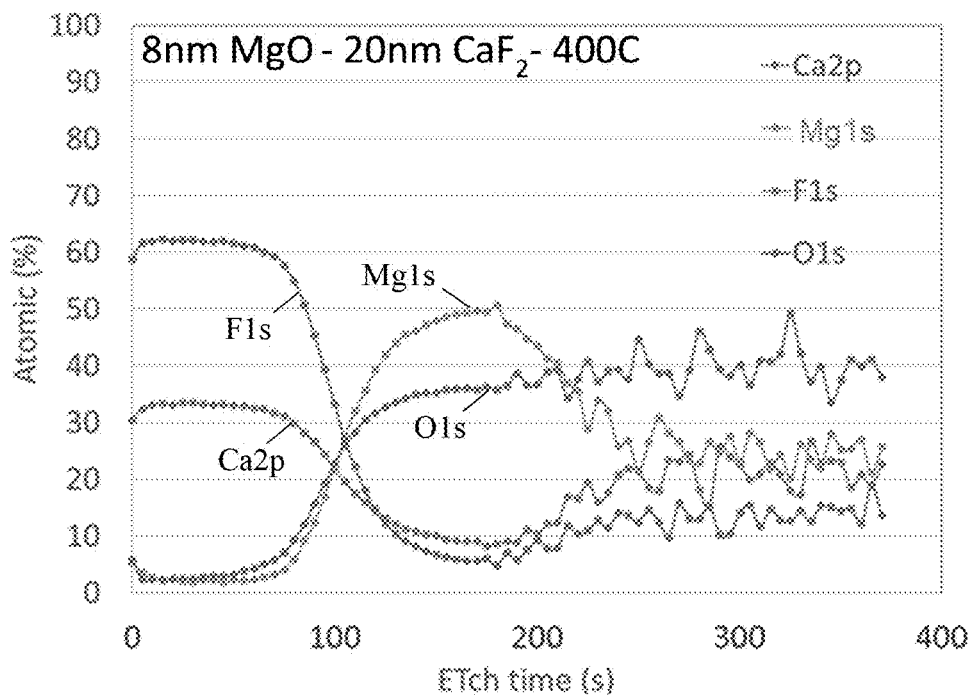

FIGS. 6A-6B show XPS depth profile measurements of ALD films. FIG. 6A illustrates the XPS data for as-deposited MgO/$CaF_2$, and FIG. 6B illustrates the XPS data for MgO/$CaF_2$ after annealing in nitrogen at 400° C. As the experimental results indicate, the F diffusion from the $CaF_2$ into the MgO is within the experimental uncertainty of the XPS depth profiling measurements of ±2%. Note that the XPS signals for F in the MgO in FIG. 6A result from instrumental broadening during the sample etching.

Figure 7A:
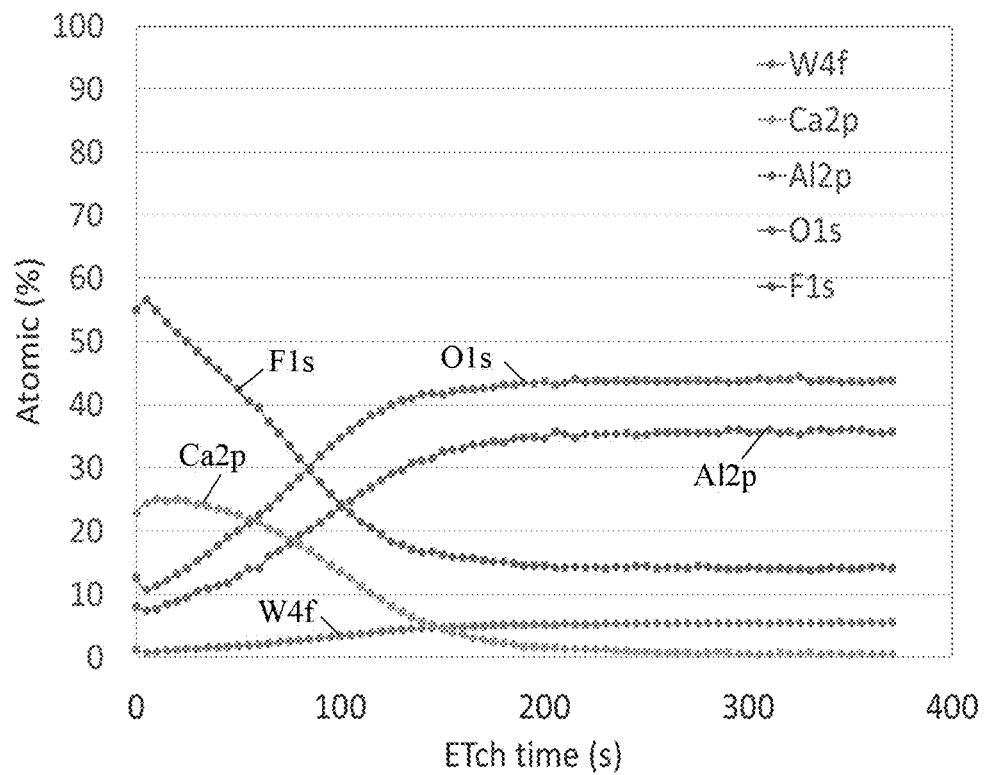
FIGS. 7A-7B show XPS depth profile measurements of ALD films.
Figure 7B:
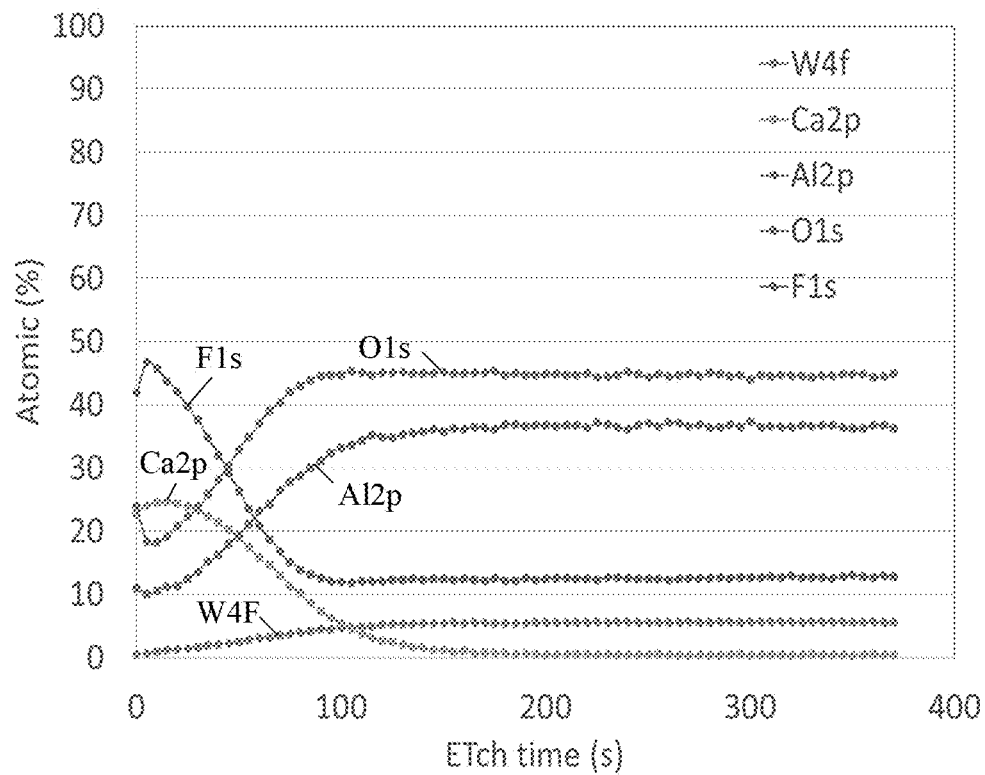

FIGS. 7A-7B show XPS depth profile measurements of ALD films. FIG. 7A illustrates the XPS data for as-deposited WAlOF with a $CaF_2$ SEY layer and FIG. 7B illustrates the XPS data for W:AlOF with a $CaF_2$ SEY layer after annealing in nitrogen at 400° C. In one embodiment, the $CaF_2$ may be used directly as the emissive layer or as a part of an emissive layer structure, such as a mixed or hybrid material emissive layer comprising $CaF_2$ and other emissive materials. Taken together, FIGS. 6A-7B demonstrate that $CaF_2$ is an effective diffusion barrier to prevent F migration from WAlOF into MgO.

Figure 8A:
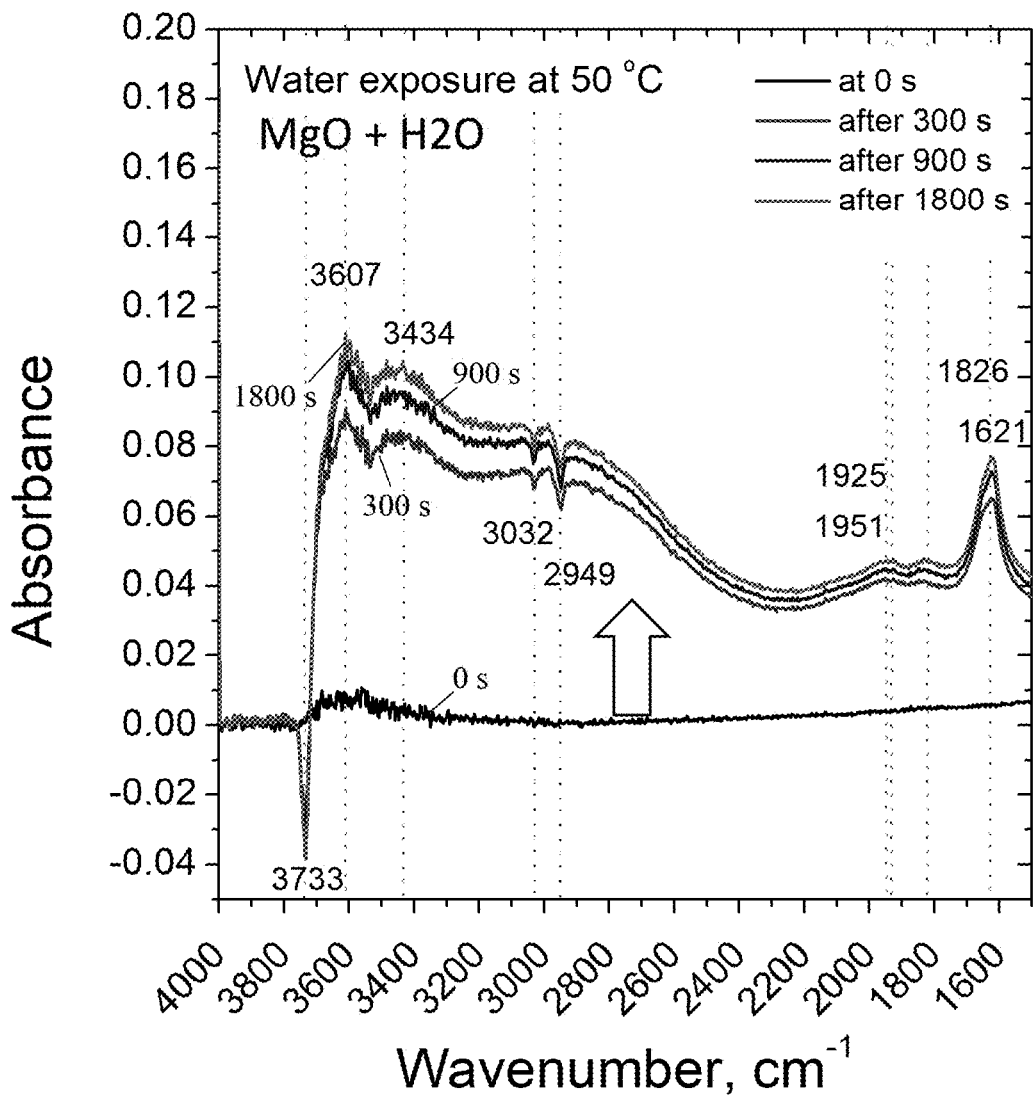
FIGS. 8A-8D illustrate IR Spec measurements.
Figure 8B:
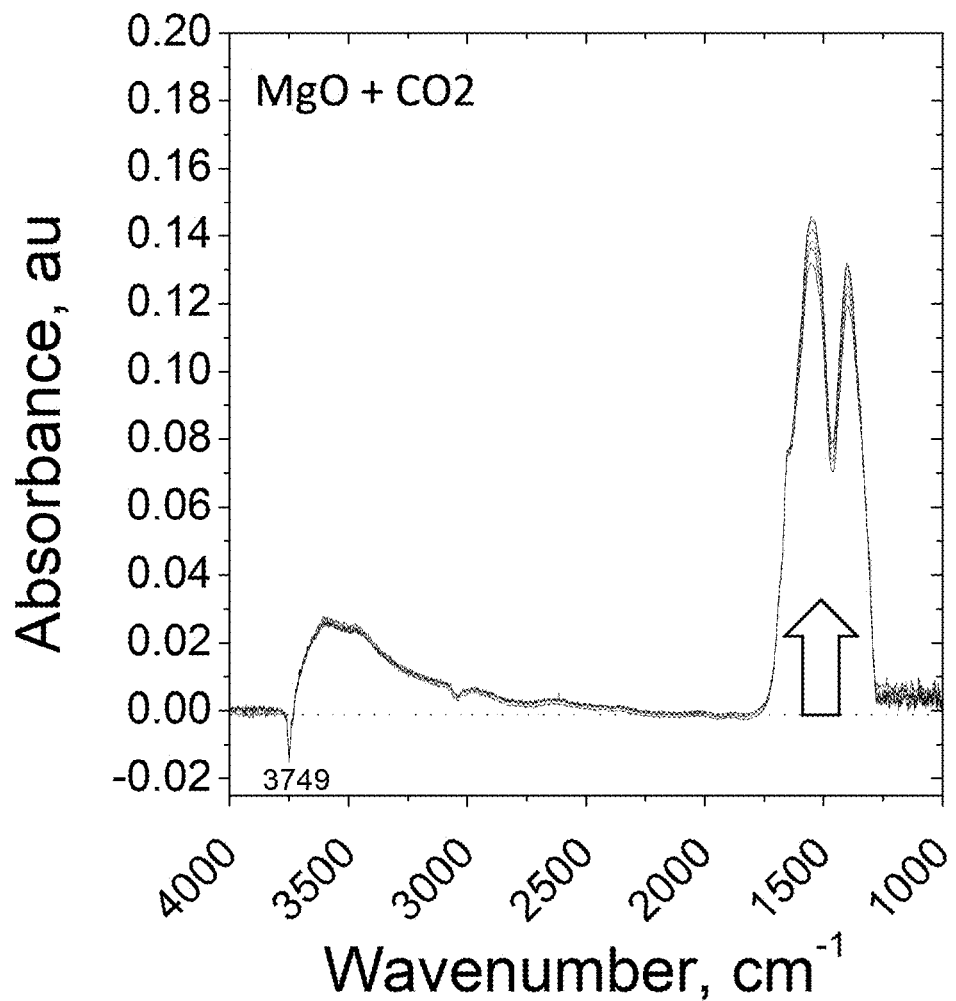
Figure 8C:
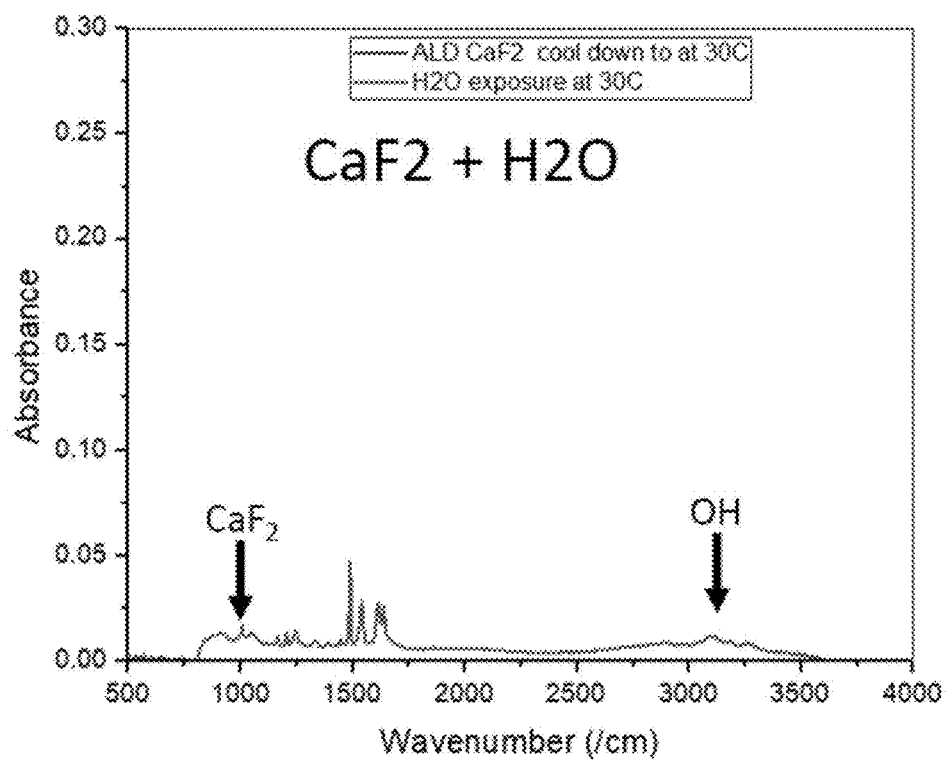
Figure 8D:
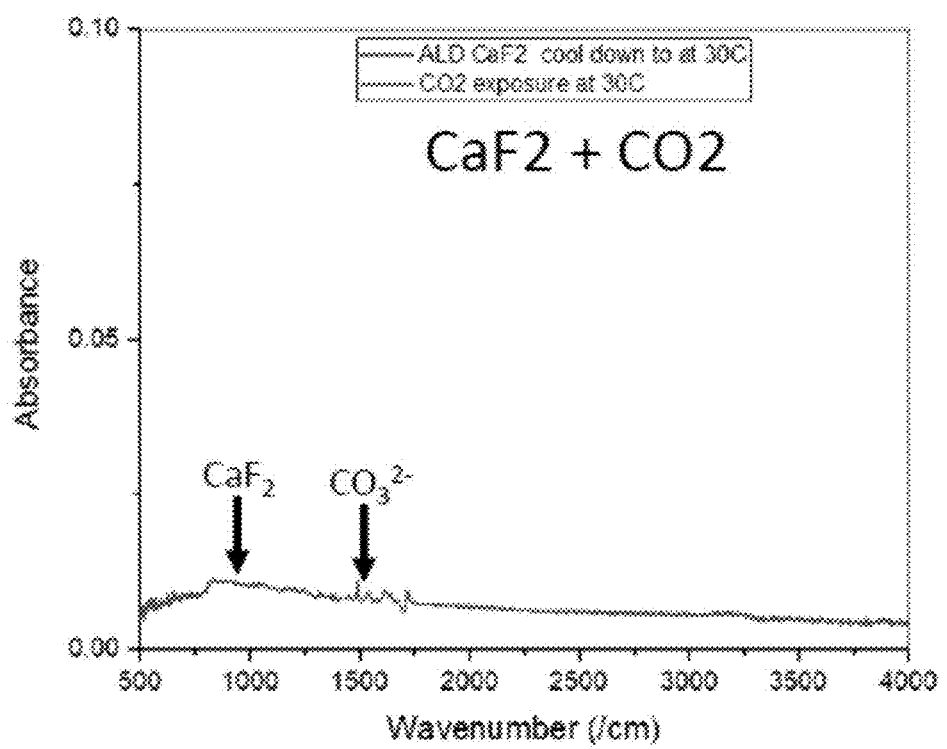

FIGS. 8A-8D illustrate IR Spec measurements. FIG. 8A shows measurements for MgO exposed to carbon dioxide, FIG. 8B shows MgO exposed to water, FIG. 8C shows $CaF_2$ exposed to carbon dioxide, and FIG. 8D shows $CaF_2$ exposed to water. These data demonstrate that MgO is susceptible to chemical changes upon exposure to carbon dioxide and water, but $CaF_2$ is not susceptible to these chemical changes.

Figure 11:
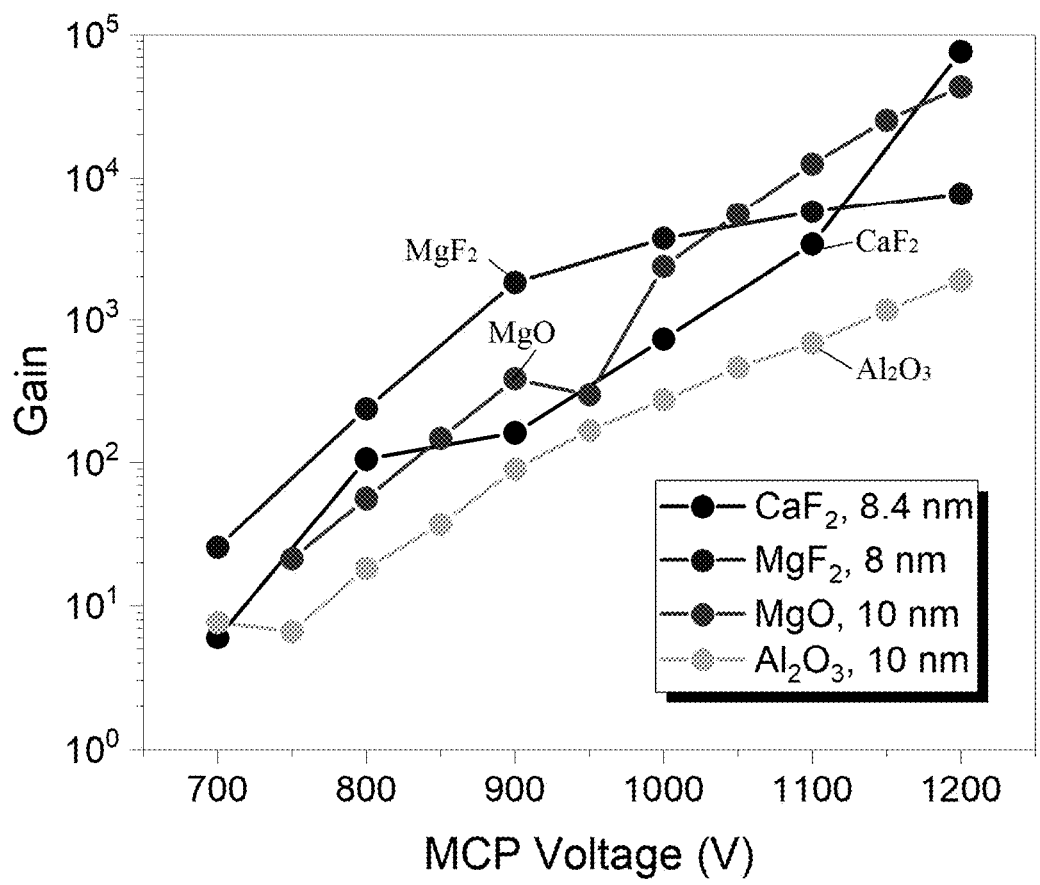
FIG. 11 is a graph of gain as a function of MCP voltage for various metal fluoride and metal oxide emissive layers. These emissive layers were deposited on separate MCP structures that were coated with WAlOF resistive layers and the gain was measured under high vacuum (Pressure=1× $10^{-6}$ Torr).

In one embodiment, $MgF_2$ may be used as an SEE layer as shown in FIG. 11. $MgF_2$ shows a stable and high gain of up to 6000.

In one embodiment, an oxyfluoride barrier layer, such as an interlayer formed between the resistive layer, such as W:AlOF and MgO layers. The oxyfluoride layer may be $MgO_xF_y$, where x is ($0<x<1$) and y is ($0<y<2$), such as where x is greater than 0 and less than 1 and y is greater than 0 and less than $2(1-x)$. In one embodiment, the oxyfluoride is deposited by ALD. For example, ALD may be by a typical ALD process using 1×MgO and 2×$MgF_2$ pulse exposures for 10 cycles total. The ratio of MgO:$MgF_2$ pulses can range from about 10:1 to 1:10.

In one embodiment, the $MgO_xF_y$ may be an SEE layer deposited directly on the resistive layer, such as W:AlOF. In one embodiment, the ALD process for deposition of $MgO_xF_y$ uses bis(ethylcyclopentadienyl) magnesium (Mg(EtCp)$_2$) and $H_2O$ for the MgO ALD and Mg(EtCp)$_2$ and HF for the $MgF_2$ ALD. The ALD temperature may be in the range of 20-350° C. and preferably 200° C. The pulse times may be in the range of 0.01-30 s and preferably 1 s. The purge times may be in the range of 1-200 s and preferably 5 s. It should be appreciated that the precursor dose and purge time is based on the self-limiting behavior of the precursors. This can be varied in wide range from a few milliseconds to 100 s of seconds. Further if a longer dose time is utilized, the purge times may need to increase to avoid a CVD type reaction, which can result in non-uniformity and particle formation. In one embodiment, a ratio of MgO deposition cycles to $MgF_2$ deposition cycles is 20:1. In one embodiment, the ALD process utilizes 20 cycles of MgO ALD (such as Mg(EtCp)$_2$ and $H_2O$) to deposit a MgO layer followed by 1 cycle of $MgF_2$ ALD (such as Mg(EtCp)$_2$ and HF), such that the deposited MgO layer is converting to $MgO_xF_y$. The ratio of F:O can be adjusted by adjusting the relative number of MgO:$MgF_2$ cycles and temperature.

In one embodiment, the W:AlOF layer(s) is deposited by ALD using a ratio of 1 W ALD cycle to 8 $Al_2O_3$ ALD cycles and may comprising 500 total ALD cycles. MgO may be formed as a single layer or comprise 100 layers. The ratio of W:AlOF to MgO may be from 5:1 to 5000:1. The $MgO_xF_y$ layer is deposited between the W:AlOF resistive layer and the MgO SEY layer and may be in a ratio of 1:2 to 1:5000 to W:AlOF and 1:1 to 500:1 to MgO. The $MgO_xF_y$ may comprise a single layer or up to 500 layers. Deliberately depositing controlled $MgO_xF_y$ as a SEE layer is believed to prevent the F-mitigation from the W:AlOF layer and can prevent uncontrolled $F^-$ mitigation from pure MgO/W:AlOF.

Figure 9A:
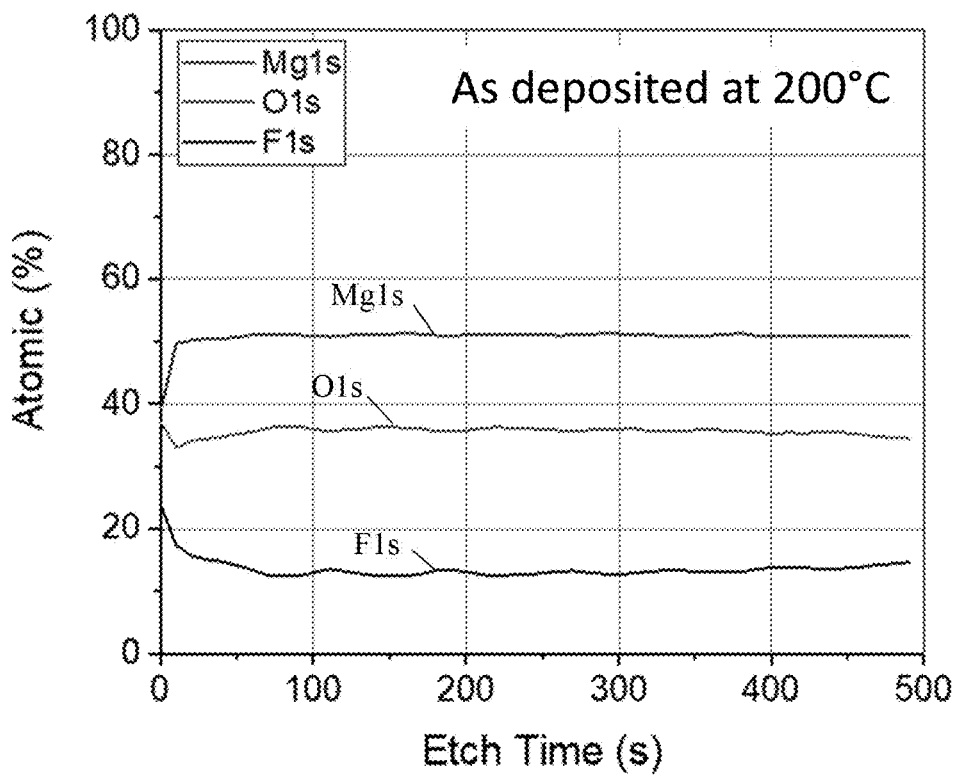
FIGS. 9A-9B show XPS depth profiling measurements of metal oxyfluoride as a SEE layer.
Figure 9B:
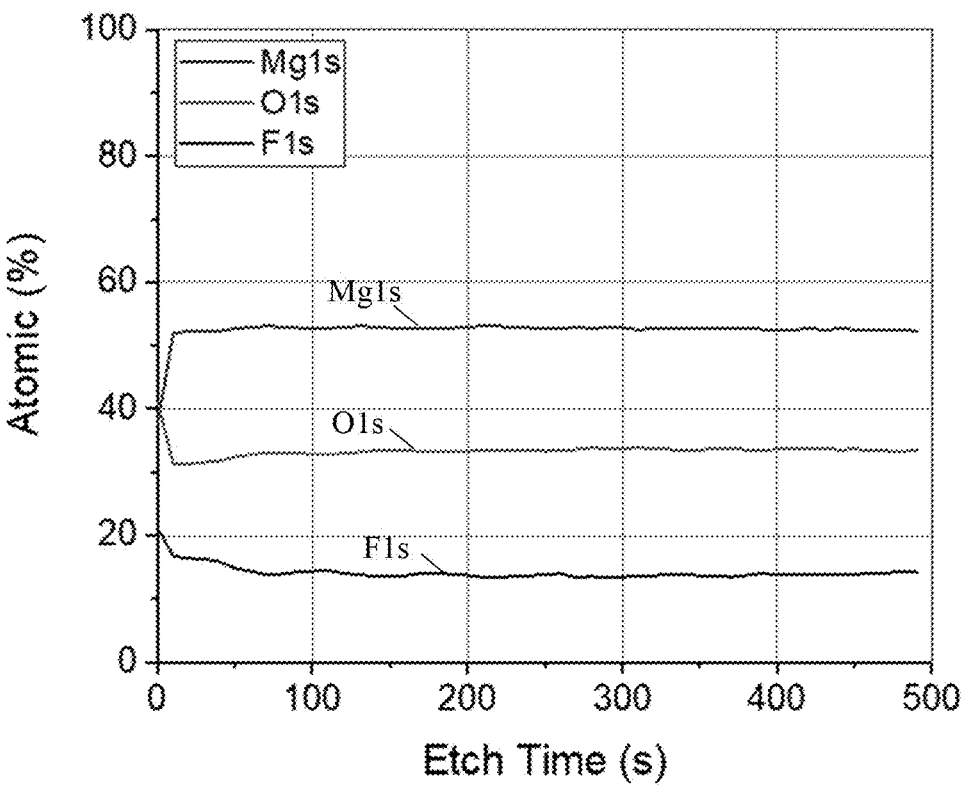

FIGS. 9A-9B show XPS depth profiling measurements of metal oxyfluoride as a SEE layer. FIG. 9A shows the $MgO_xF_y$ layer as deposited at 200° C., while FIG. 9B shows the $MgO_xF_y$ layer after 400° C. annealing. As can be seen from the experimental data, the oxyfluoride interlayer demonstrates a stable behavior during thermal annealing.

Figure 10A:
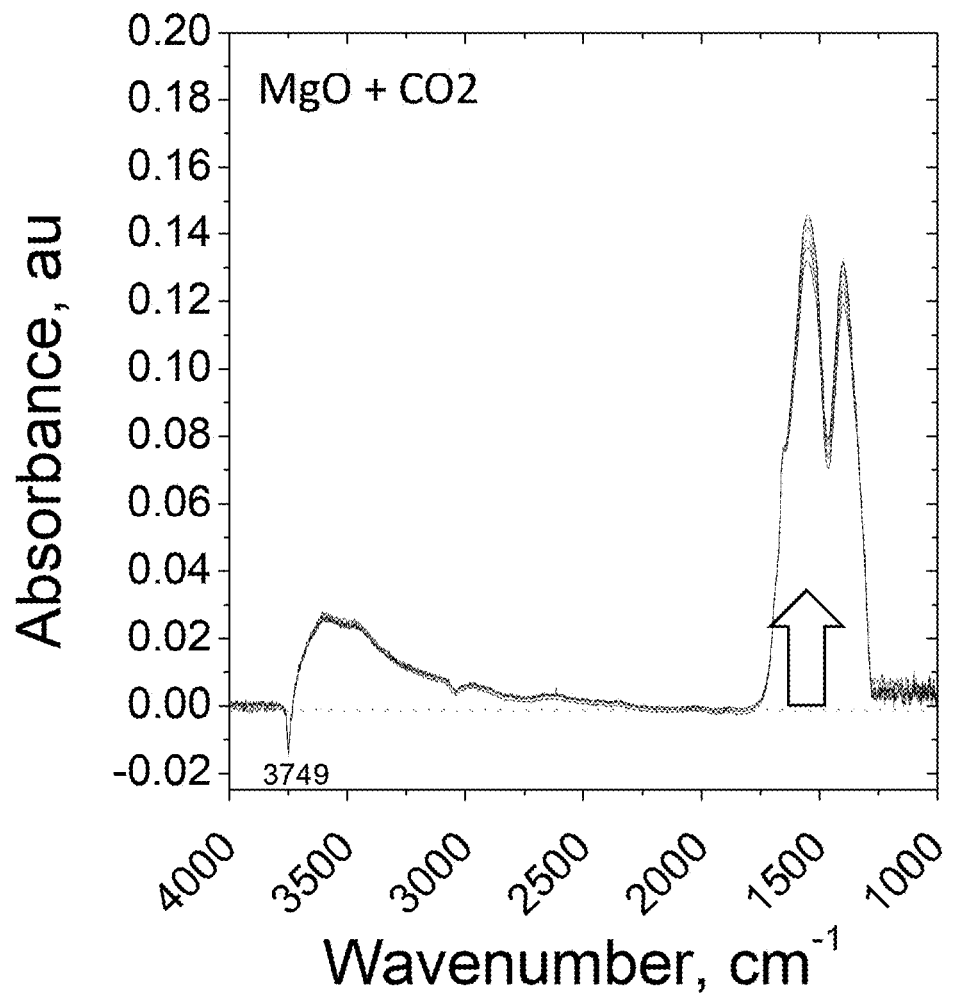
FIGS. 10A-10B are IR Spec measurement graphs showing MgO exposed to carbon dioxide (FIG. 10A) and MgOF exposed to carbon dioxide (FIG. 10B).
Figure 10B:
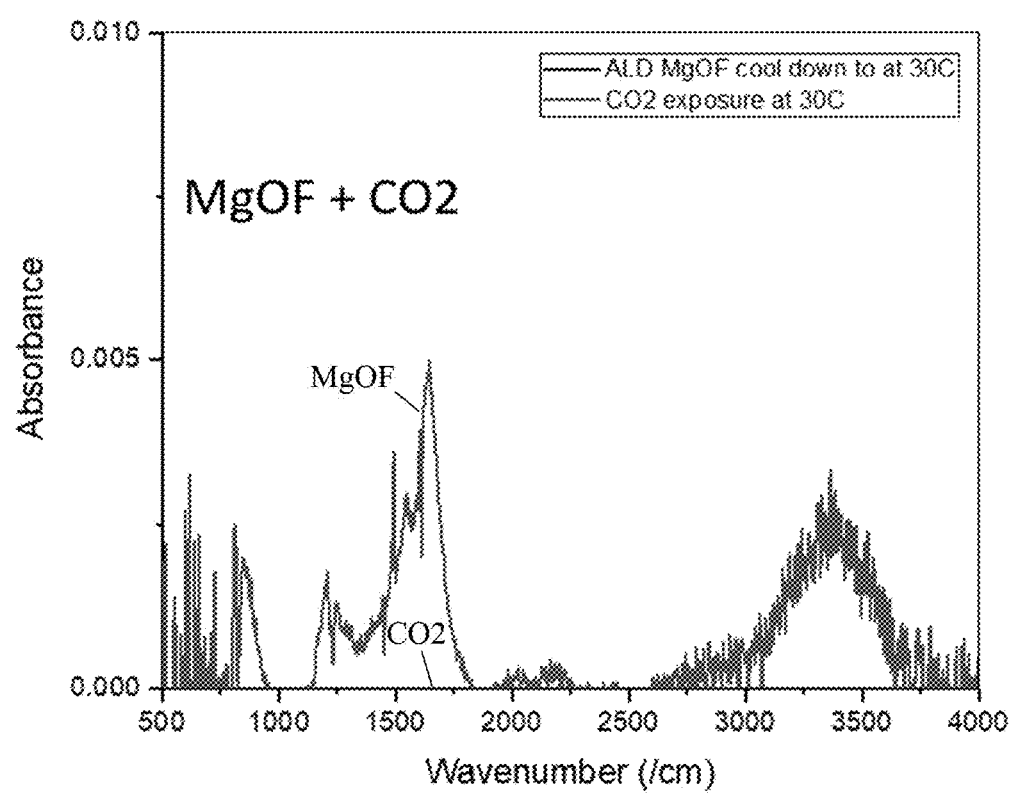

FIGS. 10A-10B are IR Spec measurement graphs showing MgO exposed to carbon dioxide vapor (FIG. 10A) and $MgO_xF_y$ exposed to carbon dioxide vapor (FIG. 10B). Reactivity experiments confirm the ability of an oxyfluoride layer to reduce reaction with environmental carbon dioxide compared to MgO emissive layers.

Figure 12:
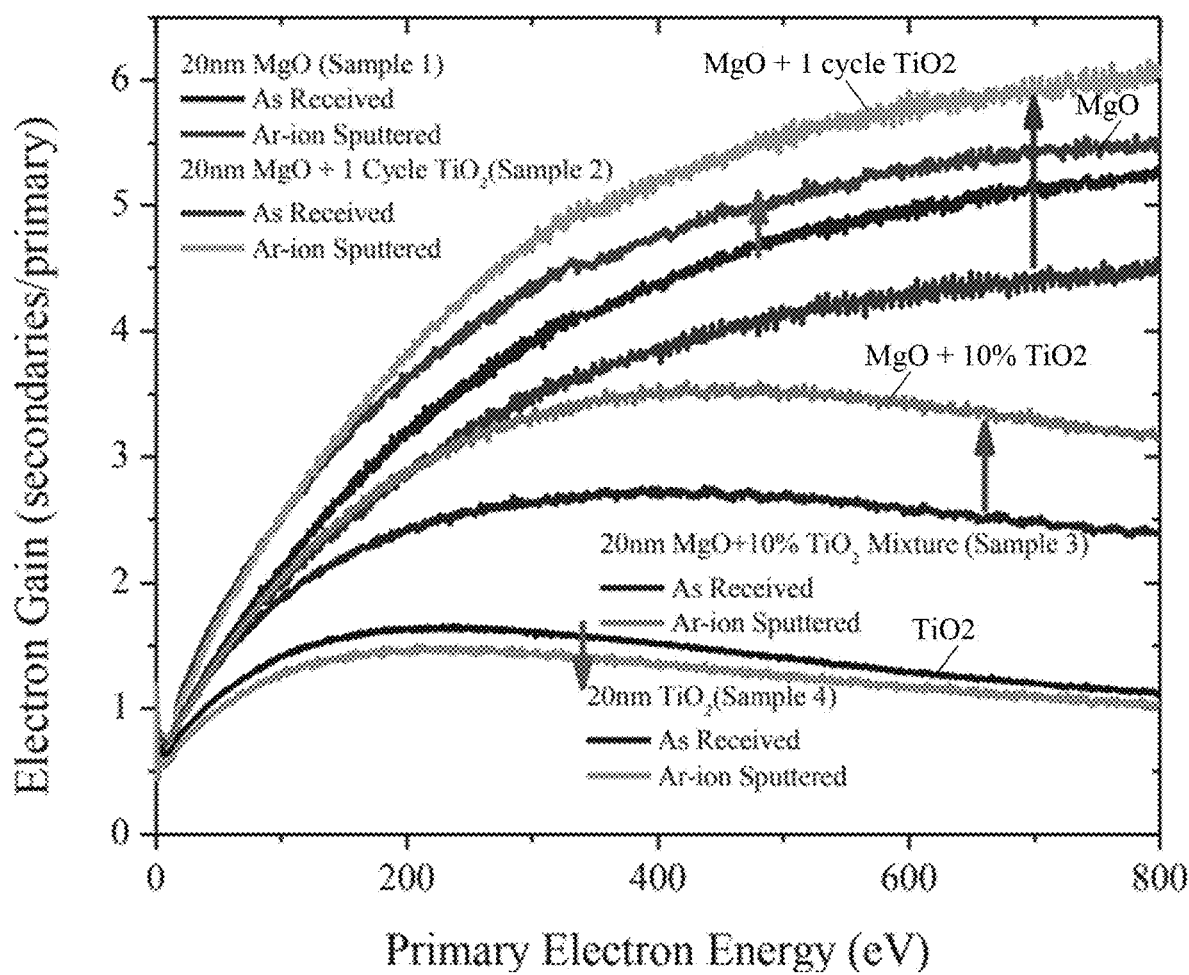
FIG. 12 is a graph of gain as a function of primary electron energy for $MgTiO_2$ mixed oxide SEE layer illustrating various control and experimental layer combinations.

FIG. 12 is a graph of gain as a function of eV for $MgTiO_2$ mixed oxide SEE layer illustrating various control and experimental layer combinations.

Definitions

No claim element herein is to be construed under the provisions of 35 U.S.C. § 112(f), unless the element is expressly recited using the phrase "means for."

As utilized herein, the terms "approximately," "about," "substantially," and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the disclosure as recited in the appended claims.

It should be noted that the term "exemplary" and variations thereof, as used herein to describe various embodiments, are intended to indicate that such embodiments are possible examples, representations, or illustrations of possible embodiments (and such terms are not intended to connote that such embodiments are necessarily extraordinary or superlative examples).

The term "coupled" and variations thereof, as used herein, means the joining of two members directly or indirectly to one another. Such joining may be stationary (e.g., permanent or fixed) or moveable (e.g., removable or releasable). Such joining may be achieved with the two members coupled directly to each other, with the two members coupled to each other using a separate intervening member and any additional intermediate members coupled with one another, or with the two members coupled to each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic. For example, circuit A communicably "coupled" to circuit B may signify that the circuit A communicates directly with circuit B (i.e., no intermediary) or communicates indirectly with circuit B (e.g., through one or more intermediaries).

The term layer or coating may refer to a complete layer, such as at least single atomic layer thick or may refer to an ad-island or other incomplete or non-uniform layer.

The term "or," as used herein, is used in its inclusive sense (and not in its exclusive sense) so that when used to connect a list of elements, the term "or" means one, some, or all of the elements in the list. Conjunctive language such as the phrase "at least one of X, Y, and Z," unless specifically stated otherwise, is understood to convey that an element may be either X, Y, Z; X and Y; X and Z; Y and Z; or X, Y, and Z (i.e., any combination of X, Y, and Z). Thus, such conjunctive language is not generally intended to imply that certain embodiments require at least one of X, at least one of Y, and at least one of Z to each be present, unless otherwise indicated.

References herein to the positions of elements (e.g., "top," "bottom," "above," "below") are merely used to describe the orientation of various elements in the figures. It should be noted that the orientation of various elements may differ according to other exemplary embodiments, and that such variations are intended to be encompassed by the present disclosure.

Although the figures and description may illustrate a specific order of method steps, the order of such steps may differ from what is depicted and described, unless specified differently above. Also, two or more steps may be performed concurrently or with partial concurrence, unless specified differently above.

What is claimed is:

1. An electron detector device comprising:
a microchannel plate having a plurality of channels extending therethrough;
a resistive layer deposited on the microchannel plate;
an emissive layer deposited on the resistive layer; and
an interlayer deposited between the resistive layer and the emissive layer;
wherein the interlayer comprises a metal oxyfluoride; and
wherein the metal oxyfluoride is $MgO_xF_y$, where x is greater than 0 and less than 1 and y is greater than 0 and less than $2(1-x)$.

2. The electron detector of claim 1, wherein the interlayer and the emissive layer are comprised of the same material.

3. A method of forming an electron amplifier comprising:
providing an electron amplifier substrate, having a resistance, within an atomic layer deposition reactor; and
depositing a barrier layer selected from a group comprising $Al_2O_3$, $MgF_2$, $CaF_2$, $MgO_xF_y$, where x is greater than 0 and less than 1 and y is greater than 0 and less than $2(1-x)$, by an atomic layer deposition process including at least one cycle of:
pulsing a first metal precursor into the reactor for a first metal precursor pulse time;
purging the reactor of the first metal precursor;
pulsing a second precursor into the reactor for a second precursor pulse time; and
purging the reactor of the second precursor.

4. The method of claim 3, wherein the electron amplifier substrate further comprises a resistive layer comprising a fluoride.

5. The method of claim 3, wherein depositing the barrier layer comprises depositing an interlayer on the electron amplifier substrate and an emissive layer on the interlayer.

6. The method of claim 3, wherein the interlayer and the emissive layer are comprised of the same material.

7. The method of claim 3, wherein the barrier layer comprises $Al_2O_3$ and is deposited on the resistive layer.

8. The method of claim 7, further comprising depositing an emissive layer on the barrier layer of $Al_2O_3$ by an atomic layer deposition process.

9. The method of claim 8, wherein the resistive layer comprises W:AlOF.

10. The method of claim 9, wherein the emissive layer comprises MgO.

11. The method of claim 5, wherein the barrier layer of $Al_2O_3$ comprises a thickness between 1 and 10 nm.

12. The method of claim 5, wherein the ratio of the barrier layer of $Al_2O_3$ to W:AlOF resistive layer is between 1:2 to 1:5000.

13. The method of claim 5, wherein the ratio of the barrier layer of $Al_2O_3$ to MgO resistive layer is between 1:1 to 1:500.

14. The method of claim 3, wherein the first metal precursor is selected from the group consisting of trimethyl aluminum, aluminum trichloride, tris(dimethylamido) aluminum, aluminum isopropoxide, and dimethyl aluminum isopropoxide.

15. The method of claim 3, wherein the first metal precursor is selected from the group consisting of Bis (cyclopentadienyl)magnesium, Bis(ethylcyclopentadienyl) magnesium, Bis(N-t-butyl-N'-ethylpropanimidamidato) magnesium, Bis(N,N'-di-sec-butylacetami dinato) magnesium, and Magnesium tetramethylheptanedionate.

* * * * *